United States Patent
Yang et al.

(10) Patent No.: US 8,540,888 B1
(45) Date of Patent: Sep. 24, 2013

(54) METHODS OF PATTERNING LAYERED-MATERIAL AND FORMING IMPRINTING MOLD

(75) Inventors: Chin-Tien Yang, New Taipei (TW); Ming-Chia Li, Taichung (TW); Chung-Ta Cheng, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/609,854

(22) Filed: Sep. 11, 2012

(30) Foreign Application Priority Data

Mar. 20, 2012 (TW) .............................. 101109443 A

(51) Int. Cl.
*B44C 1/22* (2006.01)
*C03C 15/00* (2006.01)
*C03C 25/68* (2006.01)
*C23F 1/00* (2006.01)

(52) U.S. Cl.
USPC .......................................... 216/41; 430/270.1

(58) Field of Classification Search
USPC ................. 216/41, 65; 430/5, 270.1
See application file for complete search history.

(56) References Cited

U.S. PATENT DOCUMENTS

| 5,814,431 A * | 9/1998 | Nagasaka et al. | 430/281.1 |
| 6,355,396 B1 * | 3/2002 | Nakamura | 430/281.1 |
| 7,465,530 B1 | 12/2008 | Chen | |
| 7,741,004 B2 | 6/2010 | Yang | |
| 7,741,006 B2 | 6/2010 | Yang | |
| 2010/0112491 A1 | 5/2010 | Kouchiyama | |

FOREIGN PATENT DOCUMENTS

WO WO2006045332 5/2006

OTHER PUBLICATIONS

Chin-Tien Yang, Chih-Yu Chen, Chun-Chieh Huang, Yuan-Chin Lee, Shuen-Chen Chen, and Chung-Ta Cheng "Single Wavelength Blue-Laser Optical Head-Like Opto-Mechanical System for Turntable Thermal Mode Lithography and Stamper Fabrication", Magnetics, IEEE Transactions on vol. 47, No. 3, Mar. 2011, pp. 701-705.
Chin-Tien Yang, Ming-Fang Hsu, Sheng Li Chang, Jung-Po Chen, Tzuan-Ren Jeng, and Kuo-Chi Chiu "Spin Coatable Inorganic Resist for High Density Disk Mastering Process Application", Japanese Journal of Applied Physics, vol. 47, 2008, pp. 6023-6024.
Yoshihisa Usami, Tetsuya Watanabe, Yoshinori Kanazawa, Kazuaki Taga, Hiroshi Kawai, and Kimio Ichikawa "405nm Laser Thermal Lithography of 40 nm Pattern Using Super Resolution Organic Resist Material", Applied Physics Express 2, published online Nov. 27, 2009, pp. 126502-1-126502-3, No. 7.
Yu-Hsuan Lin, Chih-Chung Yang, Chin-Tien Yang, Shi-Wei Chen, Chin-Ming Chu, and Donyau Chiang, "Deep Dry Etching Patterned Silicon Using GeSbSnOx Thermal Lithography Photoresist", Magnetics, IEEE Transactions on vol. 47, No. 3, Mar. 2011, pp. 560-563.

\* cited by examiner

*Primary Examiner* — Roberts Culbert
(74) *Attorney, Agent, or Firm* — Muncy, Geissler, Olds & Lowe, PLLC

(57) ABSTRACT

Disclosed is a method of patterning a layered material. A layered material is provided, and a photoresist layer is formed thereon. The photoresist layer is patterned by a focused laser beam to expose a part of the layered material. The exposed layered material is etched to pattern the layered material.

14 Claims, 8 Drawing Sheets

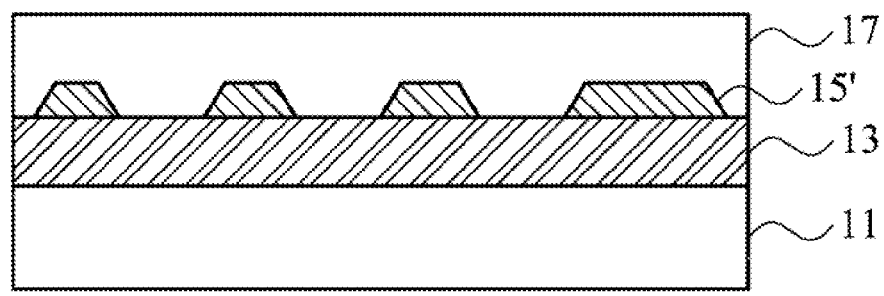
FIG. 1C'
FIG. 1C"

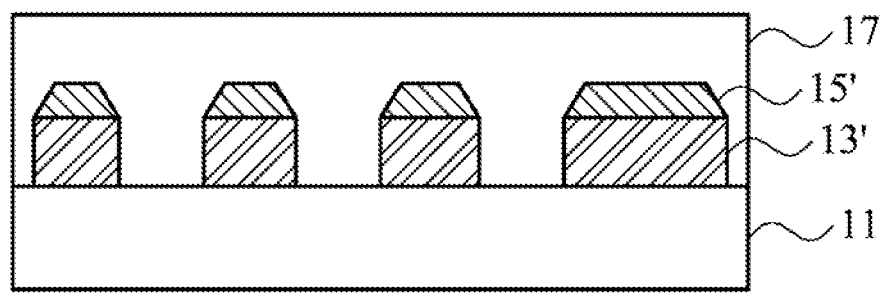
FIG. 1D'
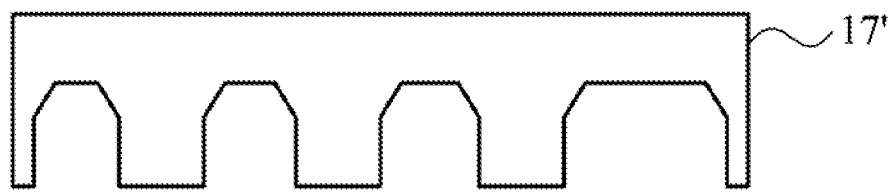
FIG. 1D"

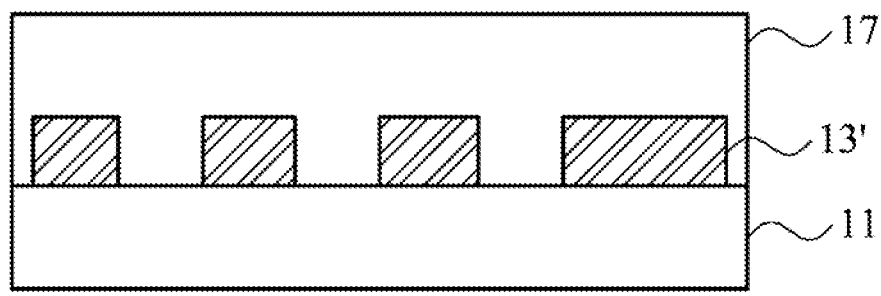
FIG. 1E'
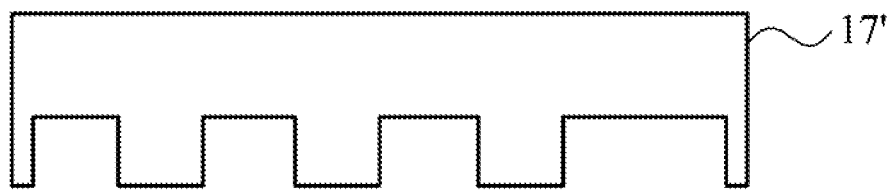
FIG. 1E"

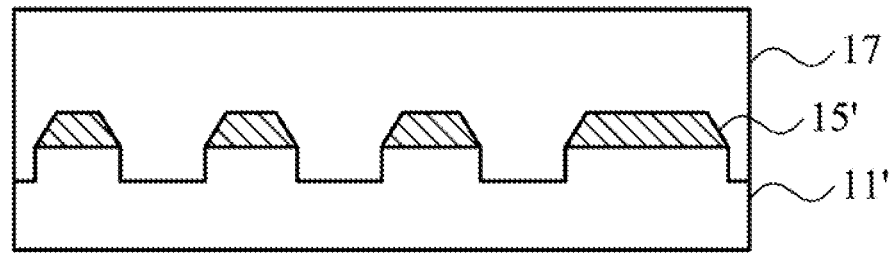
FIG. 2B'
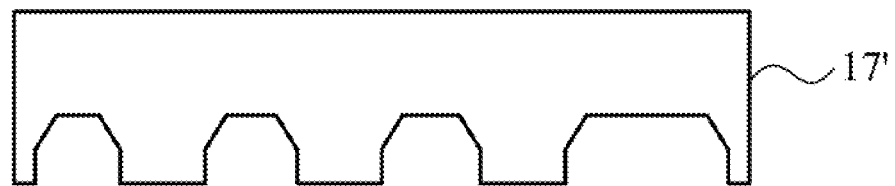
FIG. 2B"

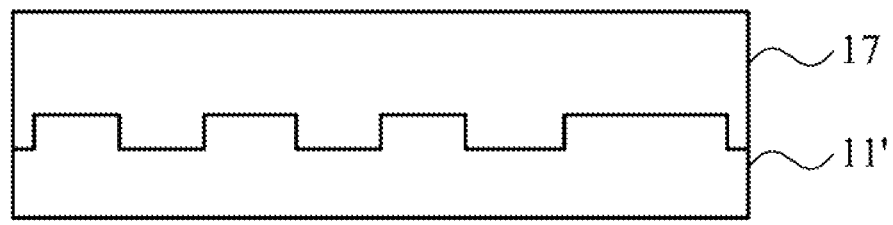
FIG. 2C'
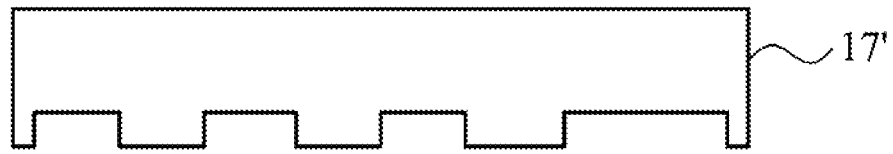
FIG. 2C"

METHODS OF PATTERNING LAYERED-MATERIAL AND FORMING IMPRINTING MOLD

CROSS REFERENCE TO RELATED APPLICATIONS

This application is based upon and claims the benefit of priority from the prior Taiwan Patent Application No. 101109443, filed on Mar. 20, 2012, the entire contents of which are incorporated herein by reference.

TECHNICAL FIELD

The disclosure relates to a method of patterning a layered material, and in particular relates to a focused laser beam and a photoresist material thereof.

BACKGROUND

A nano structured surface can be applied as an anti-reflection film, a hydrophilic/superhydrophobic pattern, a nanosensing probe, or a photonic crystal, such that methods for manufacturing the same have a large commercial value. Recently, a laser has been used to write directly on a sputtered phase transition film material (so-called phase transition mastering (PTM)) to form a master disk or a nano patterned mold.

In the PTM process, a substrate is firstly provided. A metal or metal oxide target material of phase transition material is sputtered onto a substrate to form a film by a high vacuum sputtering system. The phase transition between a crystalline state and amorphous state of the film can be controlled, such that the film can be directly written on by a laser beam. The usual sputtered film is a chalcogenide material or a metal oxide. After exposing the film by the laser beam, a film is developed by a specific wet etchant to remove (or reserve) the exposed part of the film. As such, the film is patterned. Afterward, a nickel layer is electroplated on the patterned film. Finally, the nickel layer is separated from the substrate and the patterned film thereon to form a nickel mold.

Therefore, the PTM film needs new equipment to pattern it.

SUMMARY

One embodiment of the disclosure provides a method of patterning a layered material, comprising: providing a layered material; forming a photoresist layer on the layered material; patterning the photoresist layer by a focused laser beam to expose a part of the layered material; and etching the exposed part of the layered material to pattern the layered material, wherein the photoresist layer has a chemical structure as shown in Formula 1, 2, 3, 4, 5, 6, or 7, and the Formulae are as follows:

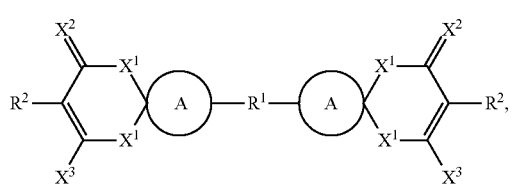

(Formula 1)

wherein: each A independently represents a substituted or a non-substituted cyclic alkyl group; $R^1$ represents a $CH_2$ group, an oxygen atom, or a $SO_2$ group; each $R^2$ independently represents a hydrogen atom, an azo group, or a substituted or a non-substituted polymethine group; each $X^1$ independently represent an oxygen atom, a $CH_2$ group, an alkyl group, or an N—$R^3$ group, wherein $R^3$ represents a hydrogen atom, a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ arylester group, an adamantyl carbonyl group, an adamantyl group, or a substituted or a non-substituted aralkyl group; each $X^2$ independently represents an oxygen atom or a $C(CN)_2$ group; and each $X^3$ independently represents an oxygen atom posing one negative charge, a hydroxyl group, or a $C(CN)_2$ group;

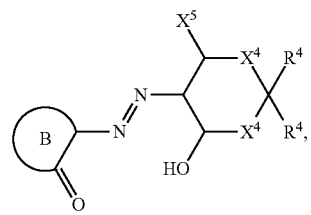

(Formula 2)

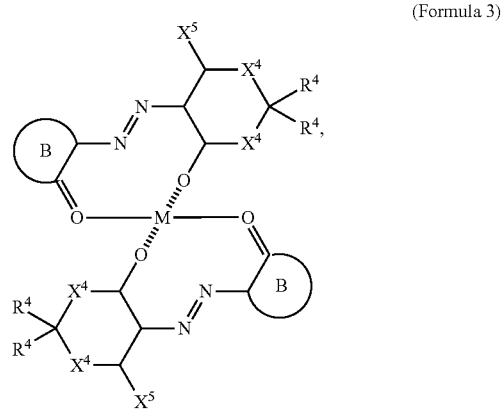

(Formula 3)

wherein each B independently represents a substituted or a non-substituted aromatic hydrocarbon ring, a substituted or a non-substituted aromatic heterocyclic ring, or a substituted or a non-substituted condensed ring including an aromatic hydrocarbon ring; each $R^4$ independently represents a hydrogen atom, a C=S group, a substituted or non-substituted alkyl group, a substituted or non-substituted aryl group, a substituted or non-substituted aralkyl group, or a substituted or non-substituted heterocyclic group; each $X^4$ independently represents an oxygen atom, a substituted or non-substituted alkyl group, or an N—$R^5$ group, wherein $R^5$ represents a hydrogen atom, a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group; each $R^5$ independently represents an oxygen atom, a $C(CN)_2$ group, or a C=O group; and M represents Fe, Co, Cu, Ni, or Zn;

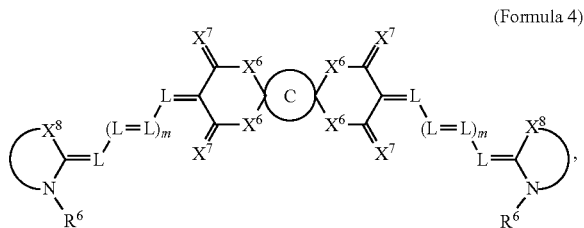

(Formula 4)

wherein C represents a substituted or a non-substituted cyclic alkyl group; each L independently represents a substituted or a non-substituted methine group; each $R^6$ independently represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group; each $X^6$ independently represents an oxygen atom, a $CH_2$ group, or an $N—R^7$ group, wherein $R^7$ represents a substituted or a non-substituted $C_{1-18}$ alkyl group; each $X^7$ independently represents an oxygen atom or a $C(CN)_2$ group; each $X^8$ independently represents a substituted or a non-substituted alkylene group, or an a substituted or a non-substituted alkylene group containing an oxygen atom, a sulfur atom, a selenium atom, or a nitrogen atom; and each m independently represents an integer of 0 or 1;

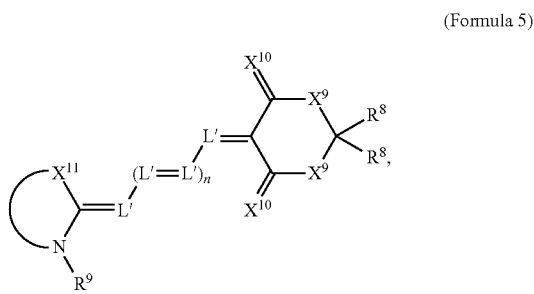

(Formula 5)

wherein each L' independently represent a substituted or a non-substituted methine group; each $R^8$ independently represents a hydrogen atom, a substituted or a non-substituted alkyl group, a substituted or a non-substituted aryl group, a substituted or a non-substituted aralkyl group, a substituted or a non-substituted heterocyclic ring, or a ferrocenyl group: $R^9$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group; each $X^9$ independently represents an oxygen atom, a $CH_2$ group, or an $N—R^{10}$ group, herein $R^{10}$ represents a substituted or a non-substituted $C_{1-18}$ alkyl group; each $X^{10}$ independently represents an oxygen atom or a $C(CN)_2$ group; $X^{11}$ represents a substituted or a non-substituted alkylene group, or a substituted or a non-substituted alkylene group containing an oxygen atom, a sulfur atom, a selenium atom, or a nitrogen atom; and n is an integer of 0 or 1;

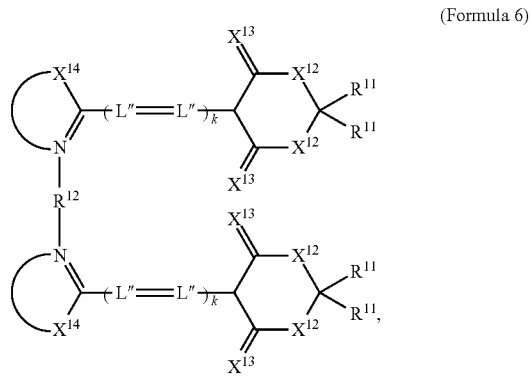

(Formula 6)

wherein each L" independently represent a substituted or a non-substituted methine group; each $R^{11}$ independently represents a hydrogen atom, a substituted or a non-substituted alkyl group, a substituted or a non-substituted aryl group, a substituted or a non-substituted aralkyl group, or a substituted or a non-substituted heterocyclic ring; $R^{12}$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group; each $X^{12}$ independently represents an oxygen atom, a $CH_2$ group, or an $N—R^{13}$ group, wherein $R^{13}$ represents a substituted or a non-substituted $C_{1-18}$ alkyl group; each $X^{13}$ independently represents an oxygen atom or a $C(CN)_2$ group; each $X^{14}$ independently represents a substituted or a non-substituted alkylene group, or a substituted or a non-substituted alkylene group containing an oxygen atom, a sulfur atom, a selenium atom, or a nitrogen atom; and each k independently represents an integer of 0 or 1;

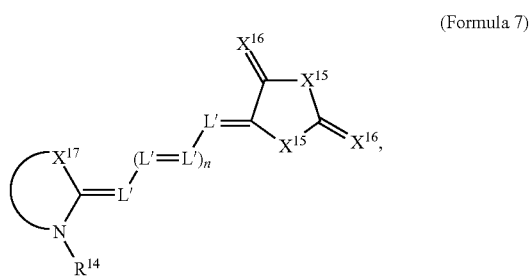

(Formula 7)

wherein each L' independently represent a substituted or a non-substituted methine group; $R^{14}$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group; each $X_{15}$ independently represents an oxygen atom, a sulfur atom, a $CH_2$ group, or an $N-R^{15}$ group, wherein $R^{15}$ represents a hydrogen atom or a substituted or a non-substituted $C_{1-18}$ alkyl group; each $X^{17}$ independently represents an oxygen atom, a sulfur atom, or a $C(CN)_2$ group; $X^{17}$ represents a substituted or a non-substituted alkylene group, or a substituted or a non-substituted alkylene group containing an oxygen atom, a sulfur atom, a selenium atom, or a nitrogen atom; and n is an integer of 0 or 1.

One embodiment of the disclosure provides a method of forming an imprinting mold, comprising: providing a layered material; forming a photoresist layer on the layered material; patterning the photoresist layer by a focused laser beam to expose a part of the layered material, plating a metal layer on the patterned photoresist layer and the exposed part of the layered material; and removing the patterned photoresist layer and the layered material from the metal layer to obtain an imprinting mold, herein the photoresist layer has a chemical structure as shown in Formula 1, 2, 3, 4, 5, 6, or 7, and the Formulae are as follows:

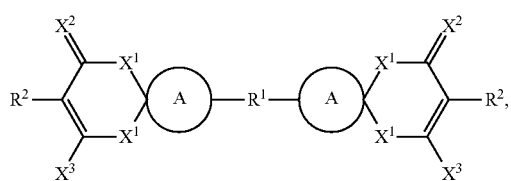

(Formula 1)

wherein each A independently represents a substituted or a non-substituted cyclic alkyl group; $R^1$ represents a $CH_2$ group, an oxygen atom, or a $SO_2$ group; each $R^2$ independently represents a hydrogen atom, an azo group, or a substituted or a non-substituted polymethine group; each $X^1$ independently represent an oxygen atom, a $CH_2$ group, an alkyl group, or an $N-R^3$ group, wherein $R^3$ represents a hydrogen atom, a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ arylester group, an adamantyl carbonyl group, an adamantyl group, or a substituted or a non-substituted aralkyl group; each $X^2$ independently represents an oxygen atom or a $C(CN)_2$ group; and each $X^3$ independently represents an oxygen atom posing one negative charge, a hydroxyl group, or a $C(CN)_2$ group;

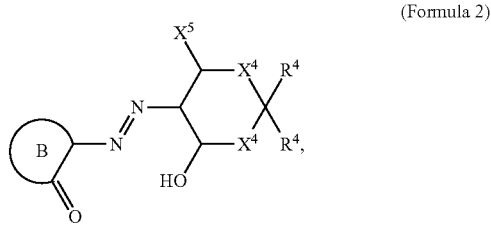

(Formula 2)

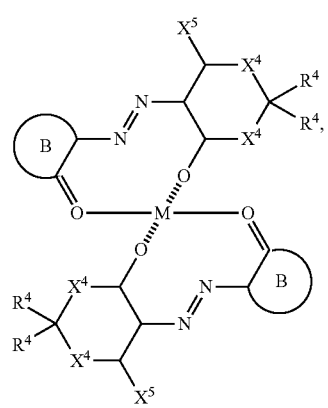

(Formula 3)

wherein each B independently represents a substituted or a non-substituted aromatic hydrocarbon ring, a substituted or a non-substituted aromatic heterocyclic ring, or a substituted or a non-substituted condensed ring including an aromatic hydrocarbon ring; each $R^4$ independently represents a hydrogen atom, a C=S group, a substituted or non-substituted alkyl group, a substituted or non-substituted aryl group, a substituted or non-substituted aralkyl group, or a substituted or non-substituted heterocyclic group; each $X^4$ independently represents an oxygen atom, a substituted or non-substituted alkyl group, or an $N-R^5$ group, wherein $R^5$ represents a hydrogen atom, a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group; each $R^5$ independently represents an oxygen atom, a $C(CN)_2$ group, or a C=O group; and M represents Fe, Co, Cu, Ni, or Zn;

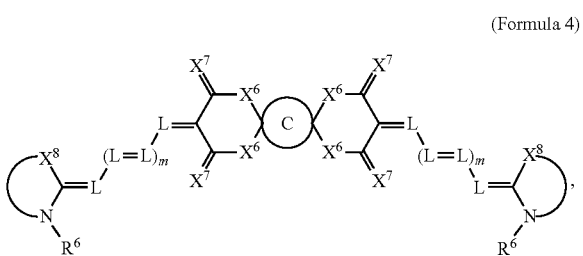

(Formula 4)

wherein C represents a substituted or a non-substituted cyclic alkyl group; each L independently represents a substituted or a non-substituted methine group; each $R^6$ independently represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group; each $X^6$ independently represents an oxygen atom, a $CH_2$ group, or an $N-R^7$ group, wherein $R^7$ represents a substituted or a non-substituted $C_{1-18}$ alkyl group; each $X^7$ independently represents an oxygen atom or a $C(CN)_2$ group; each $X^8$ independently represents a substituted or a non-substituted alkylene group, or an a substituted or a non-substituted alkylene group containing an oxygen atom, a sulfur atom, a selenium atom, or a nitrogen atom; and each m independently represents an integer of 0 or 1;

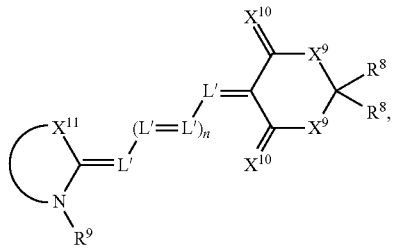

(Formula 5)

wherein each L' independently represent a substituted or a non-substituted methine group; each $R^8$ independently represents a hydrogen atom, a substituted or a non-substituted alkyl group, a substituted or a non-substituted aryl group, a substituted or a non-substituted aralkyl group, a substituted or a non-substituted heterocyclic ring, or a ferrocenyl group; $R^9$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group; each $X^9$ independently represents an oxygen atom, a $CH_2$ group, or an $N-R^{10}$ group, wherein $R^{10}$ represents a substituted or a non-substituted $C_{1-18}$ alkyl group; each $X^{10}$ independently represents an oxygen atom or a $C(CN)_2$ group; $X^{11}$ represents a substituted or a non-substituted alkylene group, or a substituted or a non-substituted alkylene group containing an oxygen atom, a sulfur atom, a selenium atom, or a nitrogen atom; and n is an integer of 0 or 1;

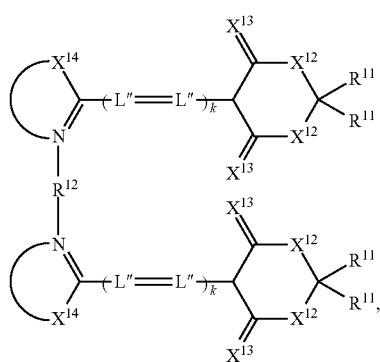

(Formula 6)

wherein each L" independently represent a substituted or a non-substituted methine group; each $R^{11}$ independently represents a hydrogen atom, a substituted or a non-substituted alkyl group, a substituted or a non-substituted aryl group, a substituted or a non-substituted aralkyl group, or a substituted or a non-substituted heterocyclic ring; $R^{12}$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group; each $X^{12}$ independently represents an oxygen atom, a $CH_2$ group, or an $N-R^{13}$ group, wherein $R^{13}$ represents a substituted or a non-substituted $C_{1-18}$ alkyl group; each $X^{13}$ independently represents an oxygen atom or a $C(CN)_2$ group; each $X^{14}$ independently represents a substituted or a non-substituted alkylene group, or a substituted or a non-substituted alkylene group containing an oxygen atom, a sulfur atom, a selenium atom, or a nitrogen atom; and each k independently represents an integer of 0 or 1;

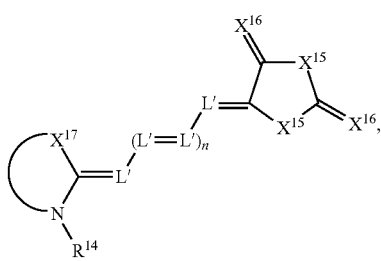

(Formula 7)

wherein each L' independently represent a substituted or a non-substituted methine group; $R^{14}$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group: each $X^{15}$ independently represents an oxygen atom, a sulfur atom, a $CH_2$ group, or an $N-R^{15}$ group, wherein $R^{15}$ represents a hydrogen atom or a substituted or a non-substituted $C_{1-18}$ alkyl group; each $X^{16}$ independently represents an oxygen atom, a sulfur atom, or a $C(CN)_2$ group; $X^{17}$ represents a substituted or a non-substituted alkylene group, or a substituted or a non-substituted alkylene group containing an oxygen atom, a sulfur atom, a selenium atom, or a nitrogen atom; and n is an integer of 0 or 1.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein:

FIGS. 1C', 1C", 1D', 1D", 1E', 1E", 2B', 2B", 2C', and 2C" show a process of forming an imprint mold in one embodiment of the disclosure.

DETAILED DESCRIPTION

Figure 1A:
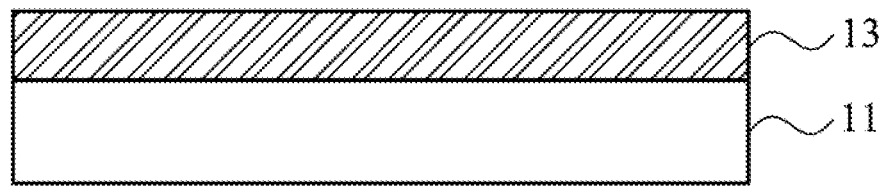
FIGS. 1A, 1B, 1C, 1D, 1E, 2A, 2B, and 2C show a process of patterning a layered material in one embodiment of the disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1B:
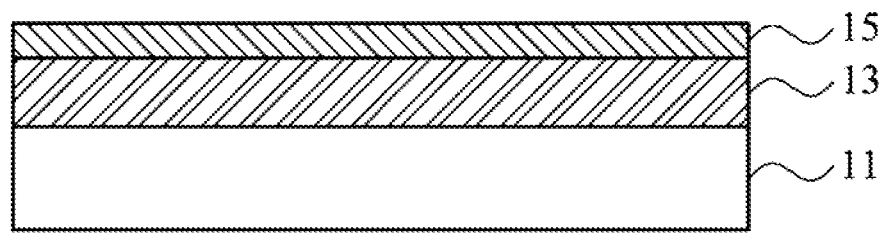
Figure 1C:
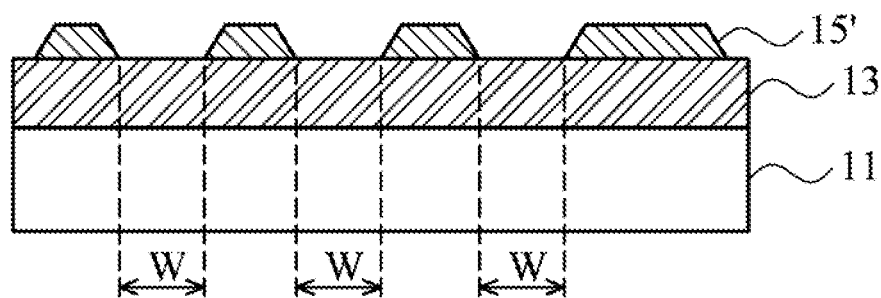

One embodiment of the disclosure provides a method to pattern a layered material. As shown in FIG. 1A, an intermediate layer 13 is firstly provided on a substrate 11. The substrate 11 can be crystalline silicon, quartz, silicon oxide, sapphire, aluminum nitride, gallium nitride, glass, polymer, or metal. The intermediate layer 13 can be aluminum oxide, aluminum nitride, silicon carbide, silicon oxide, zinc sulfide-silicon oxide, polymer, or metal. As shown in FIG. 1B, a photoresist layer 15 is then formed on the intermediate layer 13. In one embodiment, the photoresist layer 15 has a thickness of 30 nm to 200 nm. Alternatively, the photoresist layer 15 has a thickness of 50 nm to 100 nm. An overly thick photoresist layer will increase a pattern size thereof, and a bottom of the photoresist will be difficulty to degrade. An overly thin photoresist layer will make energy of a laser beam to be absorbed by the substrate rather than the photoresist layer. Next, the photoresist layer 15 is patterned by a focused laser beam to form a structure as shown in FIG. 1C. The photoresist layer 15 exposed to the laser beam is directly written to be thermal pyrolyzed, thereby exposing a part of the intermediate layer 13. Compared to conventional lithography processes, the above method to pattern the photoresist layer is free of the so-called development process. In general, the conventional development and subsequent baking steps not only cost time but also deform the photoresist pattern. The method of the disclosure without the development step may save time with better linewidth control. In one embodiment, the focused laser beam has a wavelength of 200 nm to 530 nm to meet the wavelength of maximum absorption ($\lambda_{max}$) of the photoresist layer 15. An overly long wavelength of the focused laser beam will increase the pattern size of the photoresist layer 15. Because the focused laser beam has a tapered shape (narrow at a lower part and wide at upper part), the patterned photoresist layer 15' has a tilted sidewall as shown in FIG. 1C. In addition, a bottom opening width W of the patterned photoresist layer 15' can be controlled to be 70 nm to 300 nm.

Figure 1D:
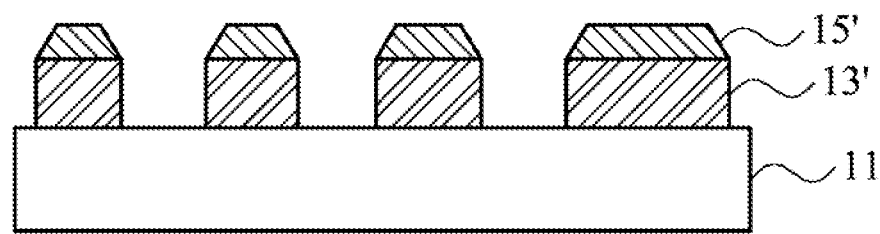

As shown in FIG. 1D, the masked part of the intermediate layer 13 is protected by the patterned photoresist layer 15', and the exposed part of the intermediate layer 13 is etched and removed to form a patterned intermediate layer 13'. The etching process can be dry etching, wet etching, or combinations thereof. The dry etching includes reactive ion etching (RIE) or inductively coupled plasma (ICP) etching. Whatever the etching process adopted, it should be an anisotropic etching process without damaging the patterned photoresist layer 15'. The etching degree depends on the desired product structure and following processes and is not limited to the structure as shown in FIG. 1D. In one embodiment, the etching process partially etches rather than penetrates the intermediate layer 13 (not shown). In one embodiment, the etching process fully penetrates the intermediate layer 13 until the substrate 11 is exposed, as shown in FIG. 1D. In certain embodiments, the intermediate layer 13 serves as a layered material.

Figure 1E:
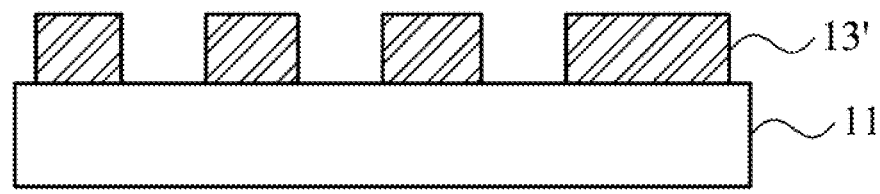

In one embodiment, the patterned photoresist layer 15' in FIG. 1D can be removed, as shown in FIG. 1E. The patterned photoresist layer 15' can be removed by wet or dry ways. The wet way may utilize water, alcohol, ketone, or combinations thereof.

Figure 2A:
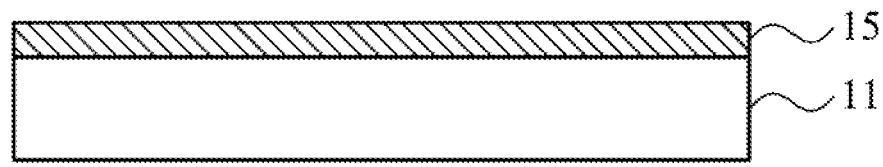
Figure 2B:
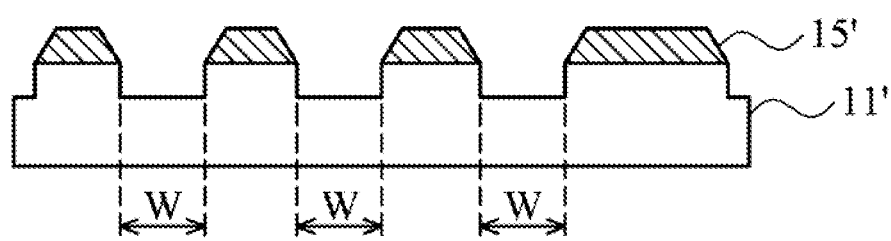

It should be understood that the intermediate layer 13 can be omitted. As such, the photoresist layer 15 is directly formed on the substrate 11 as shown in FIG. 2A. The photoresist layer 15 is then patterned by a focused laser beam, and the substrate II is then etched to form a patterned substrate 11', as shown in FIG. 2B. In certain embodiments, the substrate 11 serves as the layered material. Similarly, the etching degree depends on the desired product structure and following processes and is not limited to the structure as shown in FIG. 2B. In one embodiment, the etching process only partially etches rather than penetrates the substrate 11 (not shown). In one embodiment, the etching process fully penetrates the substrate 11, as shown in FIG. 2B.

Figure 2C:
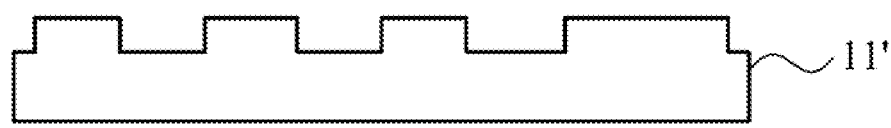

In one embodiment, the patterned photoresist layer 15' in FIG. 2B can be further removed, as shown in FIG. 2C. The patterned photoresist layer 15' can be removed by a wet way utilizing water, alcohol, ketone, or combinations thereof.

One embodiment of the disclosure provides a method of forming an imprinting mold. For example, a metal layer 17 can be formed on the structure of FIG. 1C, as shown in FIG. 1C'. Thereafter, the patterned photoresist layer 15', the intermediate layer 13, and the substrate 11 are removed to obtain an imprinting mold 17', as shown in FIG. 1C''. Similarly, a metal layer 17 can be formed on the structure of FIG. 1D, as shown in FIG. 1D'. Thereafter, the patterned photoresist layer 15', the patterned intermediate layer 13', and the substrate 11 are removed to obtain an imprinting mold 17', as shown in FIG. 1D''. Similarly, a metal layer 17 can be formed on the structure of FIG. 1E, as shown in FIG. 1E''. Thereafter, the patterned intermediate layer 13' and the substrate 11 are removed to obtain an imprinting mold 17', as shown in FIG. 1E''. Similarly, a metal layer 17 can be formed on the structure of FIG. 2B, as shown in FIG. 2B'. Thereafter, the patterned photoresist layer 15' and the substrate 11 are removed to obtain an imprinting mold 17', as shown in FIG. 2B''. Similarly, a metal layer 17 can be formed on the structure of FIG. 2C, as shown in FIG. 2C'. Thereafter, the patterned substrate 11' is removed to obtain an imprinting mold 17', as shown in FIG. 2C''. The metal layer 17 can be nickel, silver, platinum, or alloys thereof. The metal layer 17 can be formed by sputtering or plating.

For patterning the layered structure as above, the photoresist layer should be a specific material to collocate the focused laser beam with a specific wavelength. For example, the photoresist layer may have a chemical formula as shown in Formula 1.

(Formula 1)

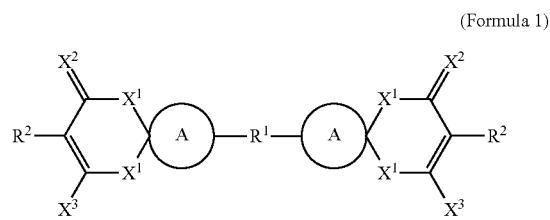

In Formula 1: each A independently represents a substituted or a non-substituted cyclic alkyl group; $R^1$ represents a $CH_2$ group, an oxygen atom, or a $SO_2$ group; each $R^2$ independently represents a hydrogen atom, an azo group, or a substituted or a non-substituted polymethine group; each $X^1$ independently represent an oxygen atom, a $CH_2$ group, an alkyl group, or an N—$R^3$ group, wherein $R^3$ represents a hydrogen atom, a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ arylester group, an adamantyl carbonyl group, an adamantyl group, or a substituted or a non-substituted aralkyl group; each $X^2$ independently represents an oxygen atom or a $C(CN)_2$ group; and each $X^3$ independently represents an oxygen atom posing one negative charge, a hydroxyl group, or a $C(CN)_2$ group.

Formula 1 can be, but is not limited to, specific compounds as shown in Formula 1-1 to 1-25.

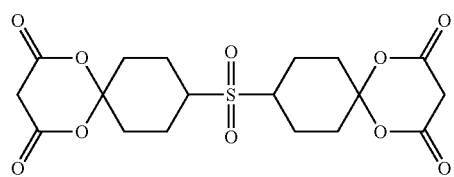
(Formula 1-1)
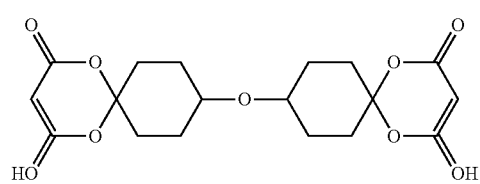
(Formula 1-2)
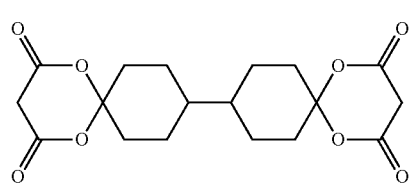
(Formula 1-3)
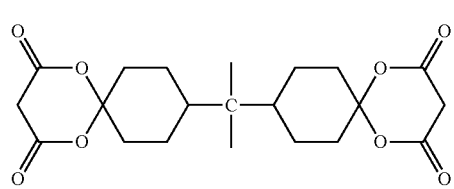
(Formula 1-4)
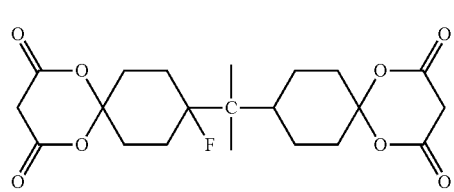
(Formula 1-5)
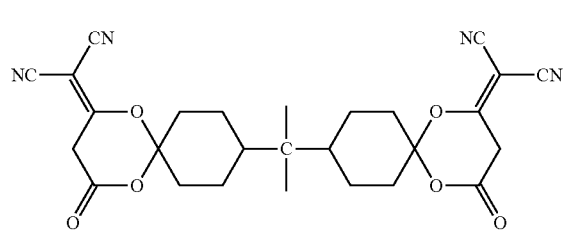
(Formula 1-6)
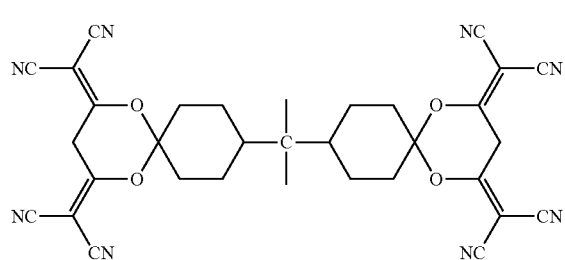
(Formula 1-7)

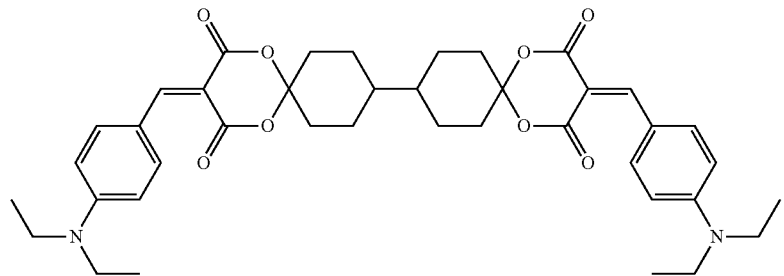
(Formula 1-8)
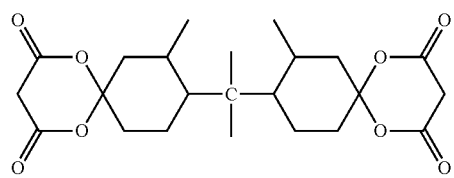
(Formula 1-9)
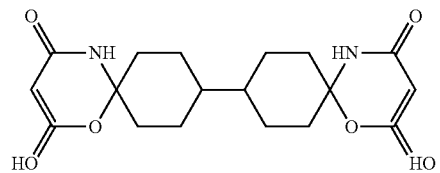
(Formula 1-10)
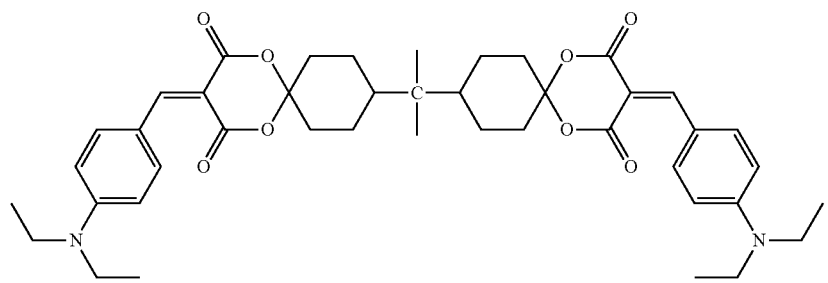
(Formula 1-11)
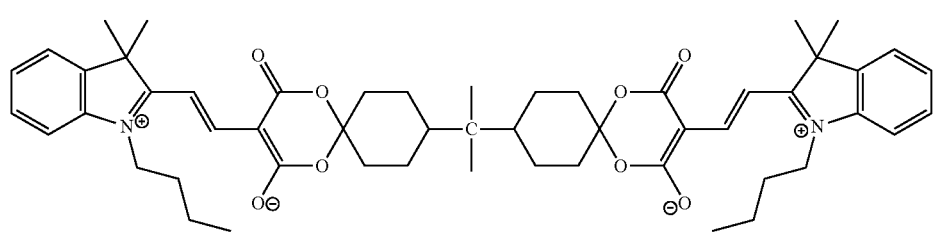
(Formula 1-12)
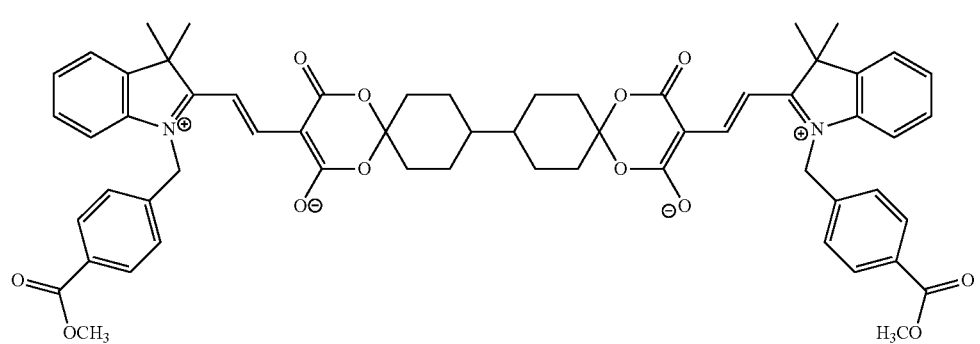
(Formula 1-13)

-continued
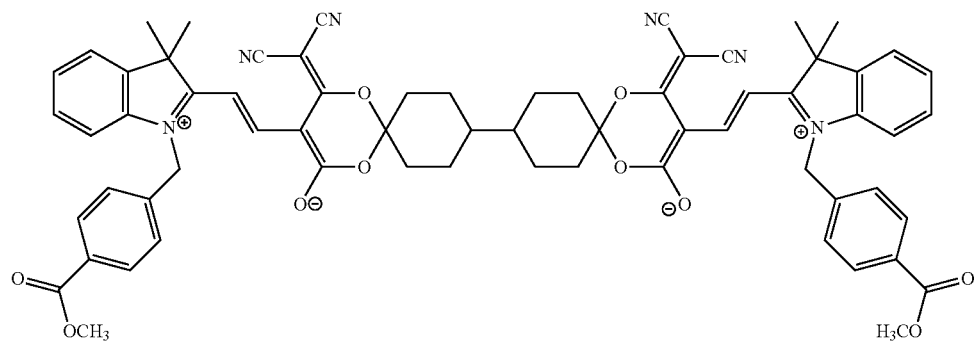
(Formula 1-14)
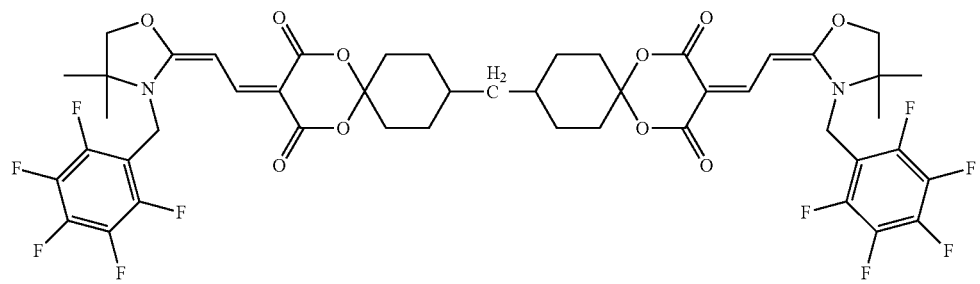
(Formula 1-15)
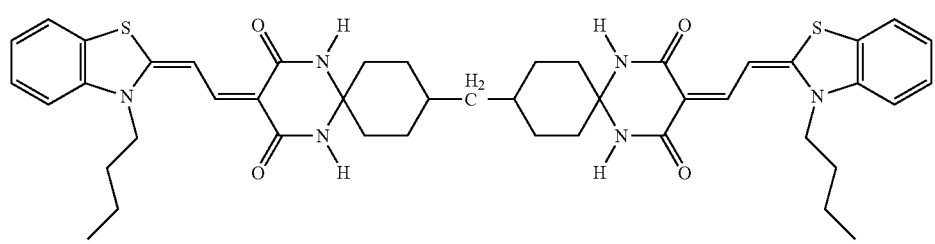
(Formula 1-16)
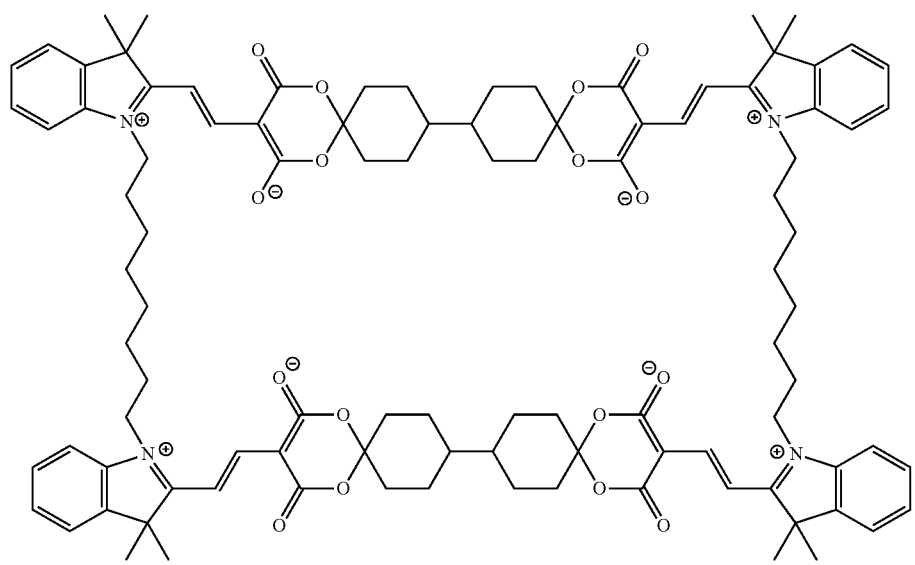
(Formula 1-17)

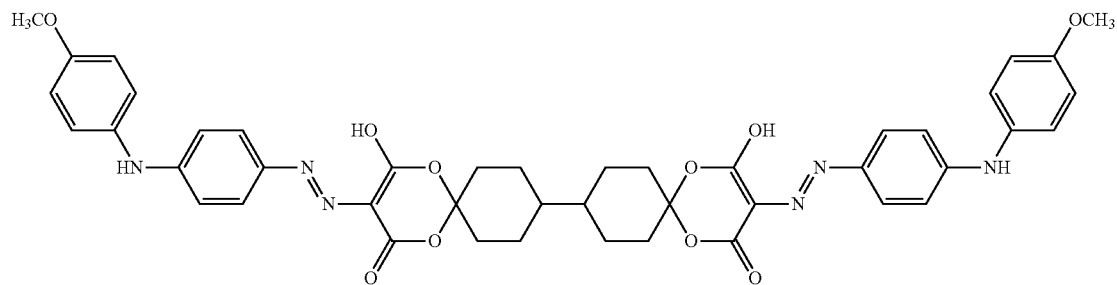
(Formula 1-18)
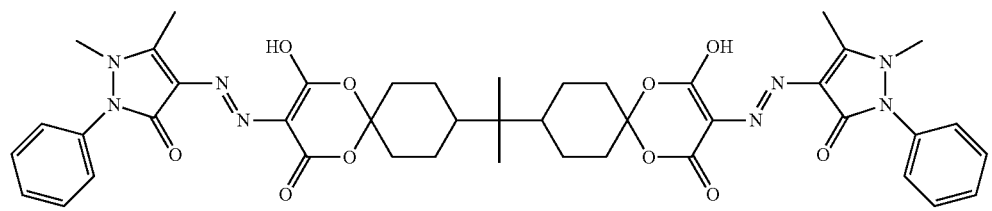
(Formula 1-19)
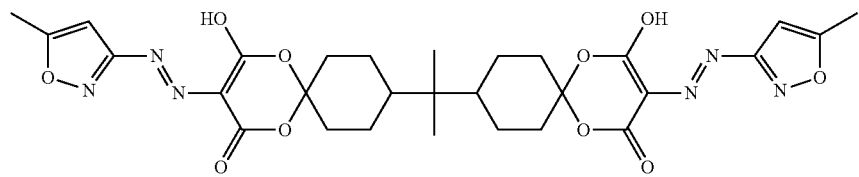
(Formula 1-20)
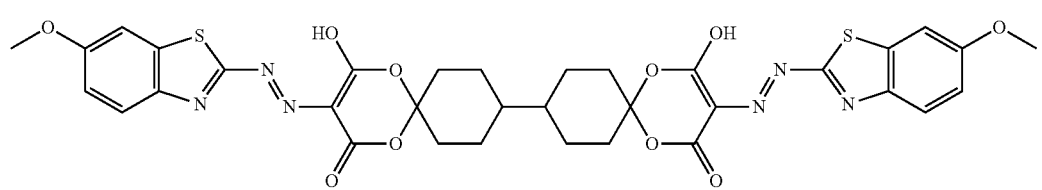
(Formula 1-21)
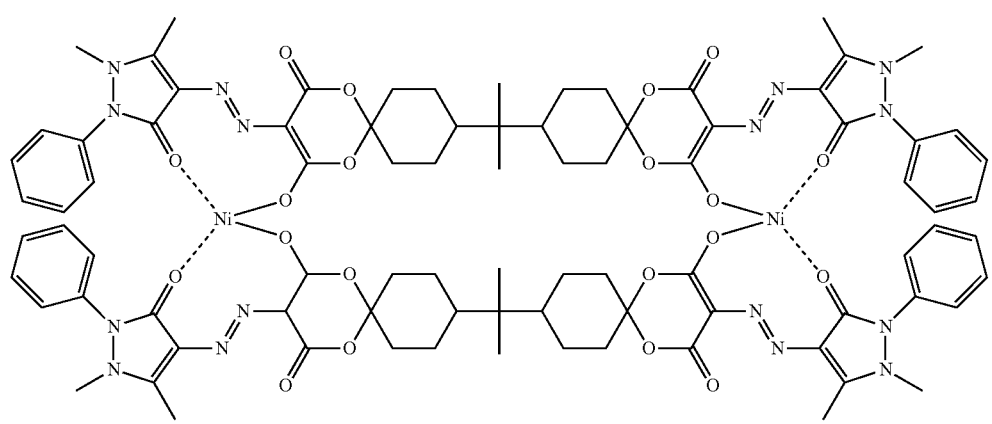
(Formula 1-22)

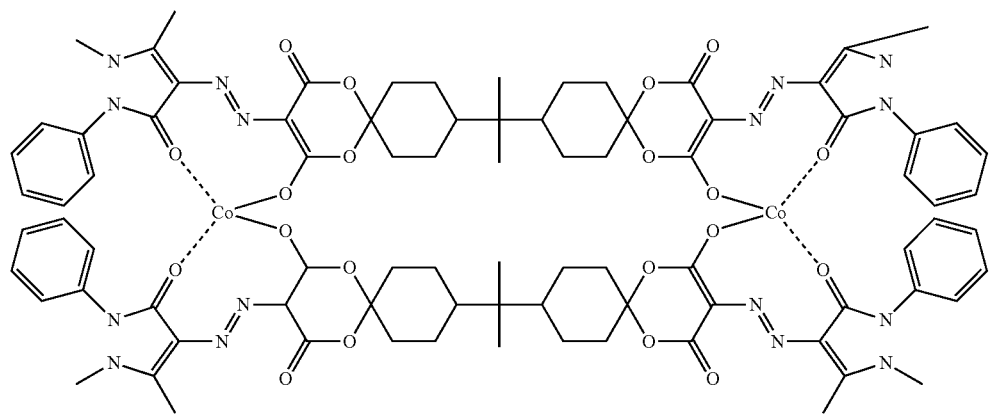
(Formula 1-23)
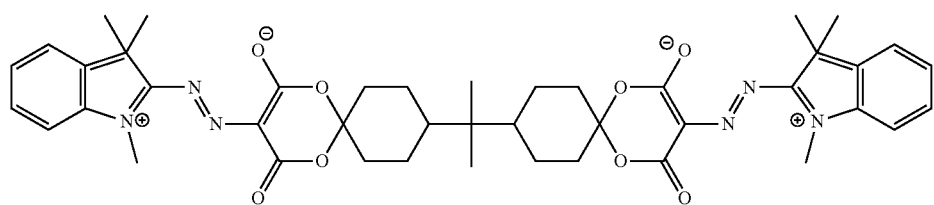
(Formula 1-24)
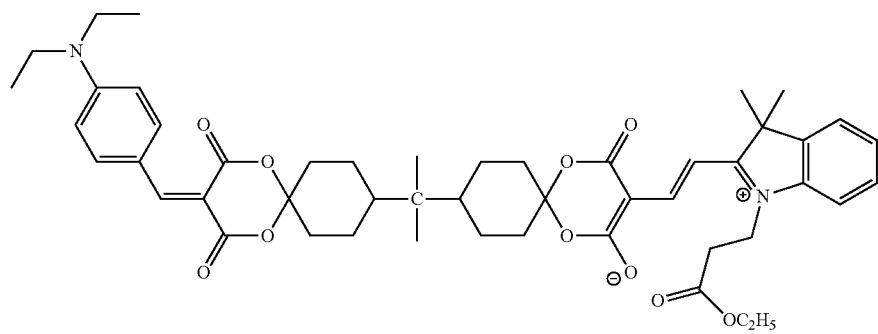
(Formula 1-25)

The photoresist layer may have a chemical formula as shown in Formula 2 or 3.

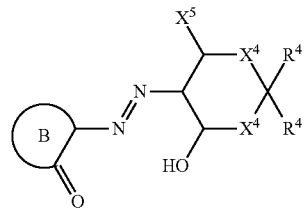
(Formula 2)

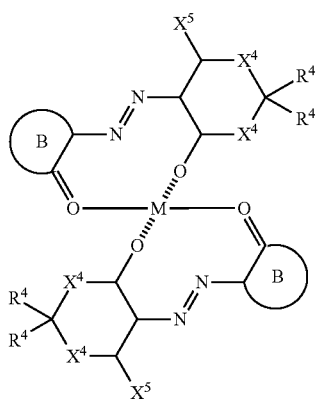
(Formula 3)

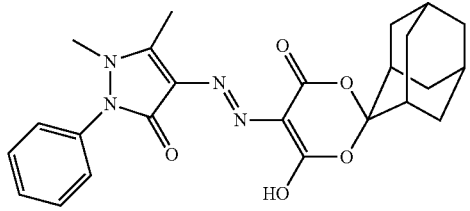
(Formula 2-1)

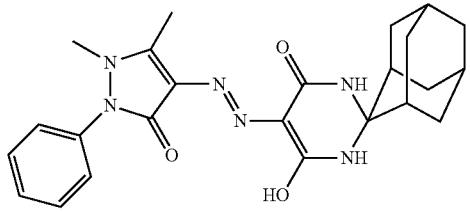
(Formula 2-2)

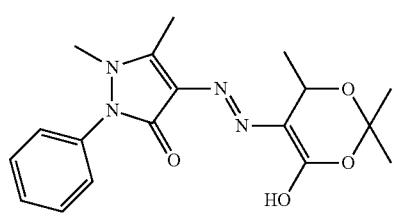
(Formula 2-3)

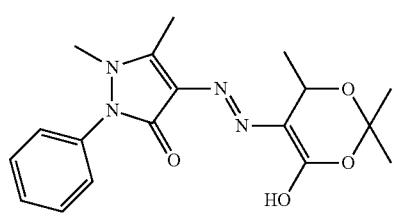
(Formula 2-4)

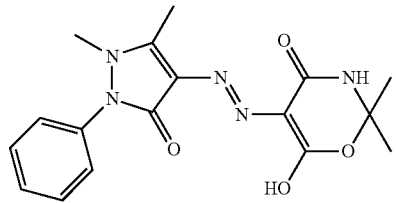
(Formula 2-5)

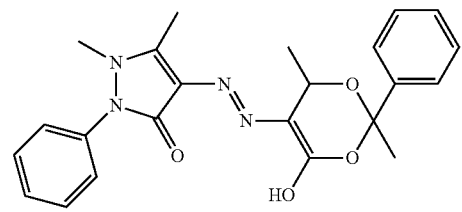
(Formula 2-6)

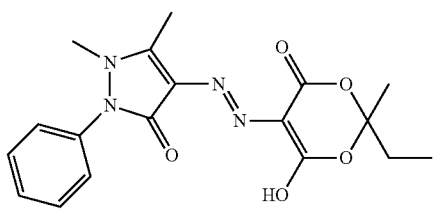
(Formula 2-7)

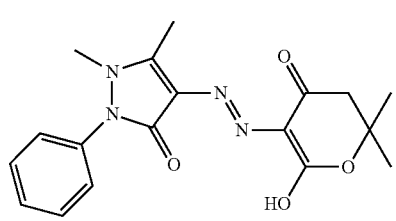

In Formula 2 or 3: each B independently represents a substituted or a non-substituted aromatic hydrocarbon ring, a substituted or a non-substituted aromatic heterocyclic ring, or a substituted or a non-substituted condensed ring including an aromatic hydrocarbon ring; each $R^4$ independently represents a hydrogen atom, a C=S group, a substituted or non-substituted alkyl group, a substituted or non-substituted aryl group, a substituted or non-substituted aralkyl group, or a substituted or non-substituted heterocyclic group; each $X^4$ independently represents an oxygen atom, a substituted or non-substituted alkyl group, or an N—$R^5$ group, wherein $R^5$ represents a hydrogen atom, a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group; each $R^5$ independently represents an oxygen atom, a $C(CN)_2$ group, or a C=O group; and M represents Fe, Co, Cu, Ni, or Zn.

Formula 2 can be, but is not limited to, specific compounds as shown in Formula 2-1 to 2-10.

(Formula 2-8)
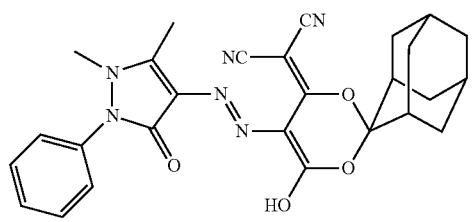
(Formula 2-9)
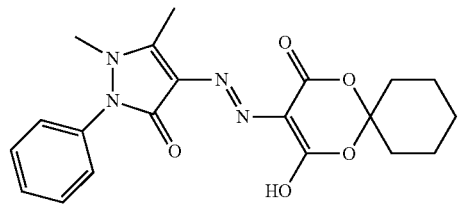
(Formula 2-10)
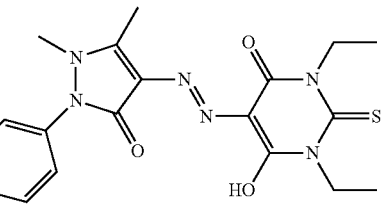
(Formula 3-2)
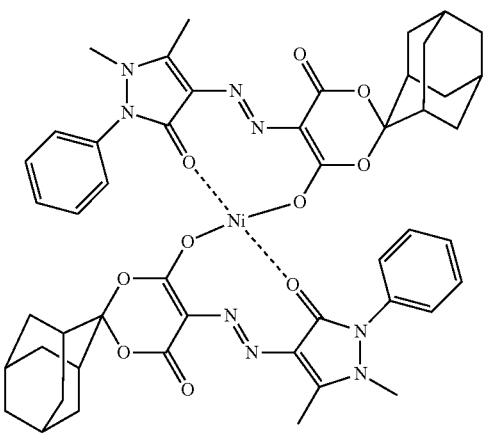
(Formula 3-3)
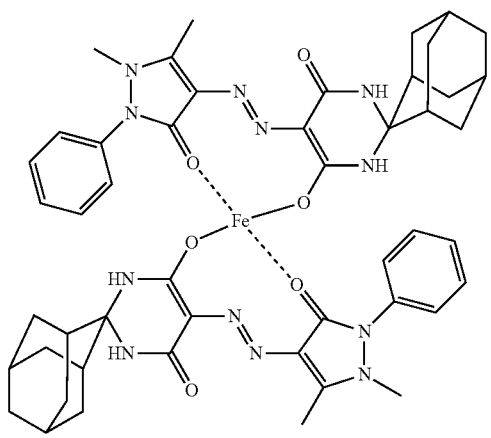
Formula 3 can be, but is not limited to, specific compounds as shown in Formula 3-1 to 3-9.
(Formula 3-1)
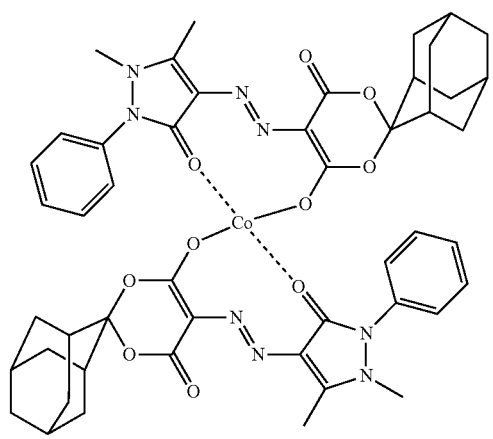
(Formula 3-4)
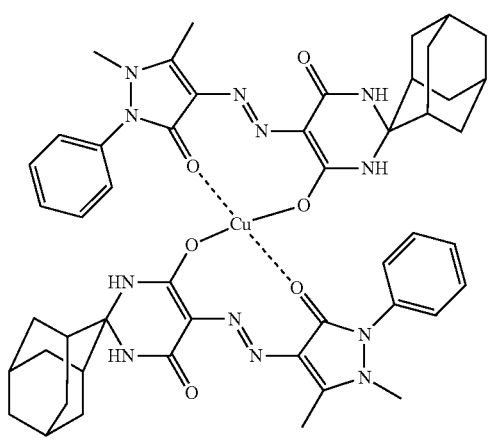

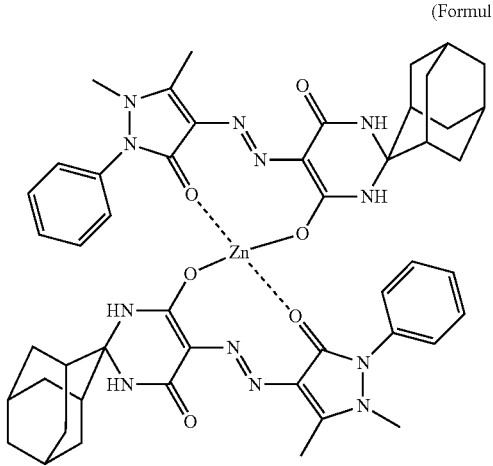

(Formula 3-5)

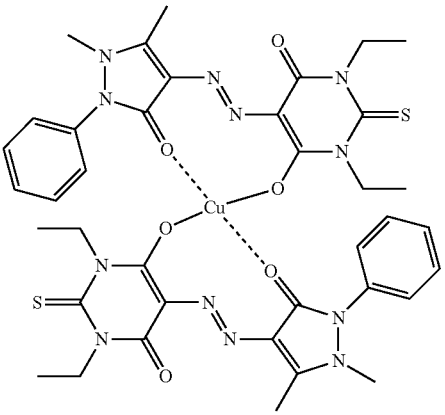

(Formula 3-7)

The photoresist layer may have a chemical formula as shown in Formula 4.

(Formula 4)

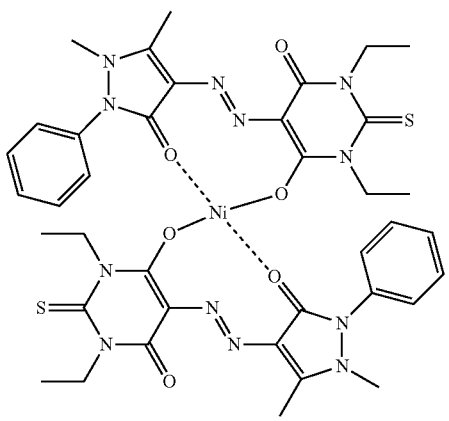

(Formula 3-6)

In Formula 4: C represents a substituted or a non-substituted cyclic alkyl group; each L independently represents a substituted or a non-substituted methine group; each $R^6$ independently represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group; each $X^6$ independently represents an oxygen atom, a $CH_2$ group, or an N—R' group, wherein $R^7$ represents a substituted or a non-substituted $C_{1-18}$ alkyl group; each $X^7$ independently represents an oxygen atom or a $C(CN)_2$ group; each $X^8$ independently represents a substituted or a non-substituted alkylene group, or an a substituted or a non-substituted alkylene group containing an oxygen atom, a sulfur atom, a selenium atom, or a nitrogen atom; and each m independently represents an integer of 0 or 1.

Formula 4 can be, but is not limited to, specific compounds as shown in Formula 4-1 to 4-3.

(Formula 4-1)

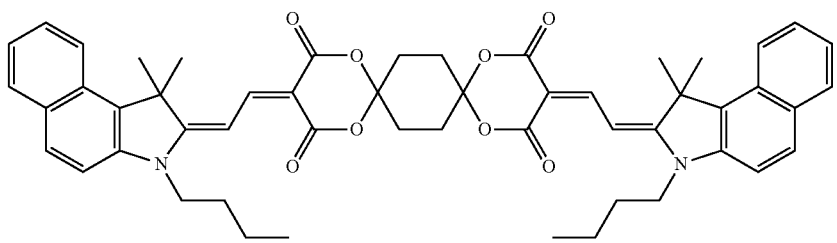

(Formula 4-2)

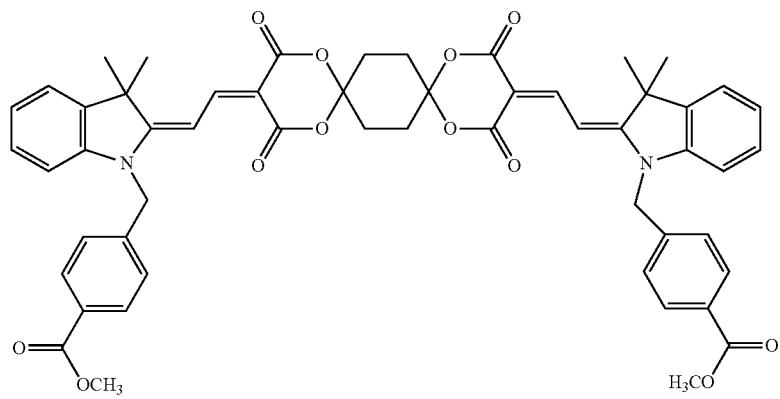

(Formula 4-3)

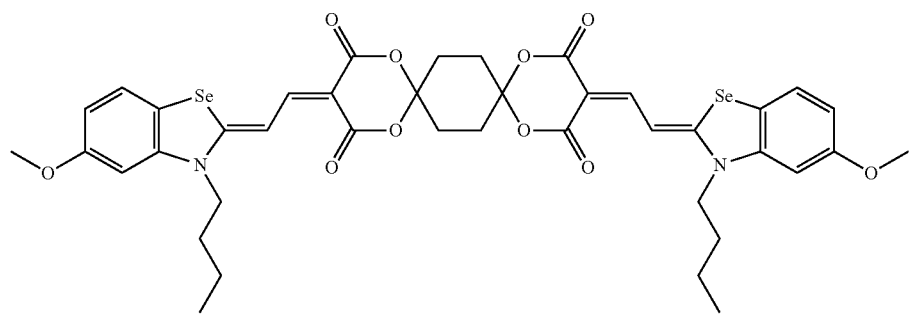

The photoresist layer may have a chemical formula as shown in Formula 5.

Formula 5 can be, but is not limited to, specific compounds as shown in Formula 5-1 to 5-21.

(Formula 5)

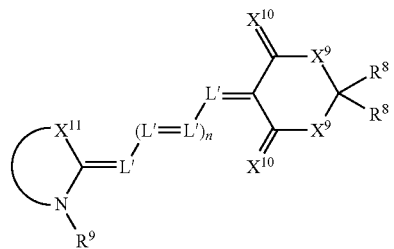

(Formula 5-1)

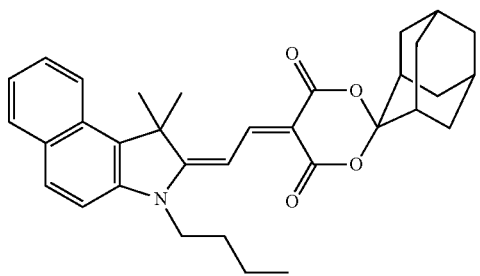

In Formula 5: each L' independently represent a substituted or a non-substituted methine group: each $R^8$ independently represents a hydrogen atom, a substituted or a non-substituted alkyl group, a substituted or a non-substituted aryl group, a substituted or a non-substituted aralkyl group, a substituted or a non-substituted heterocyclic ring, or a ferrocenyl group; $R^9$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group: each $X^9$ independently represents an oxygen atom, a $CH_2$ group, or an $N-R^{10}$ group, wherein $R^{10}$ represents a substituted or a non-substituted $C_{1-18}$ alkyl group; each $X^{10}$ independently represents an oxygen atom or a $C(CN)_2$ group: $X^{11}$ represents a substituted or a non-substituted alkylene group, or a substituted or a non-substituted alkylene group containing an oxygen atom, a sulfur atom, a selenium atom, or a nitrogen atom; and n is an integer of 0 or 1.

(Formula 5-2)

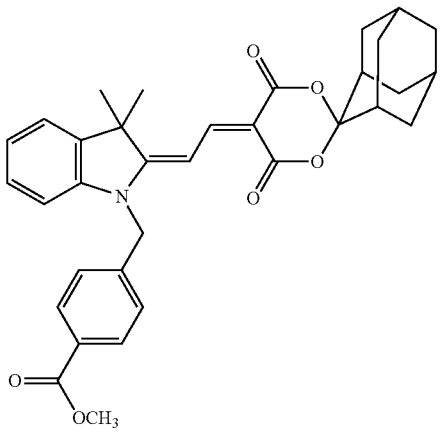

(Formula 5-3)
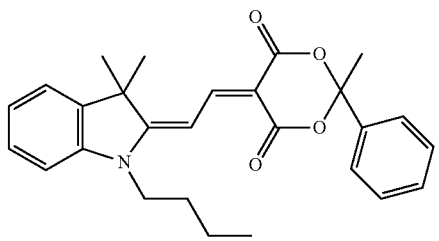
(Formula 5-4)
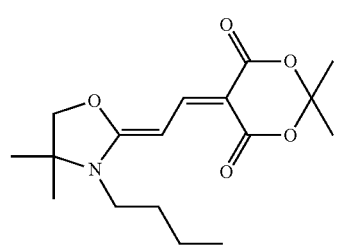
(Formula 5-5)
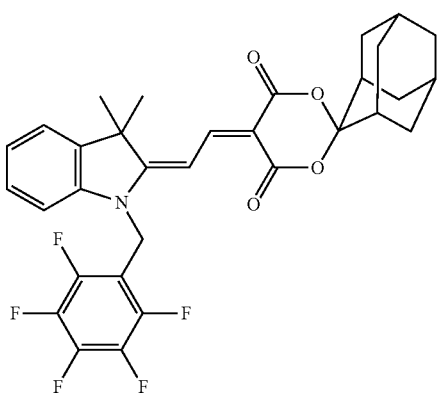
(Formula 5-6)
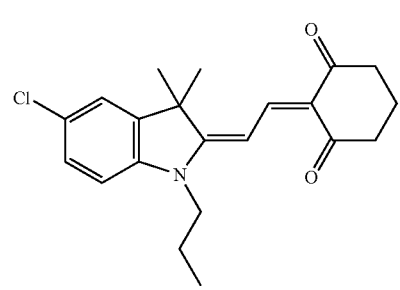
(Formula 5-7)
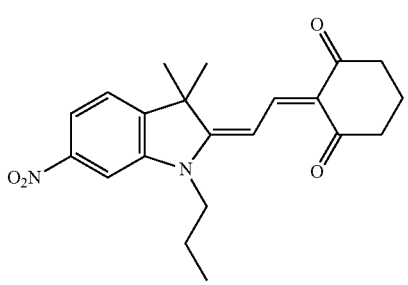
(Formula 5-8)
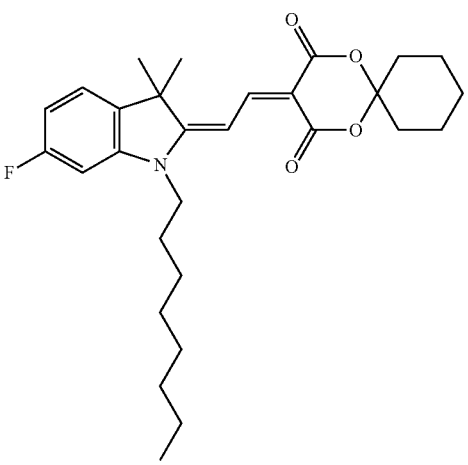
(Formula 5-9)
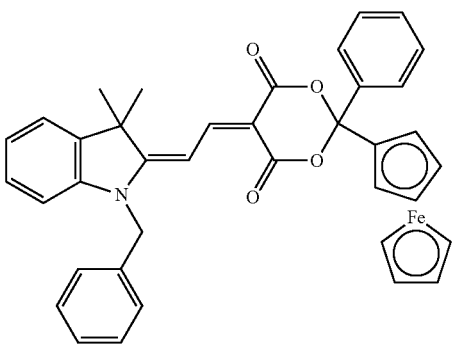
(Formula 5-10)
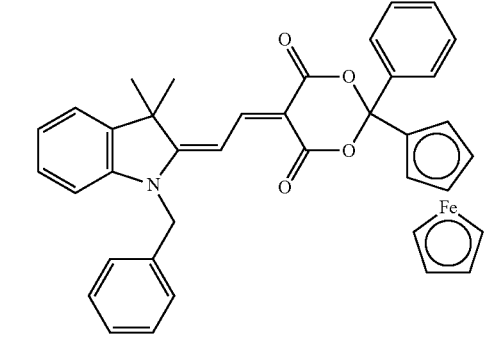
(Formula 5-11)
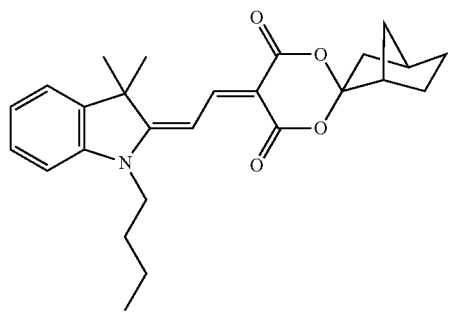

(Formula 5-12)
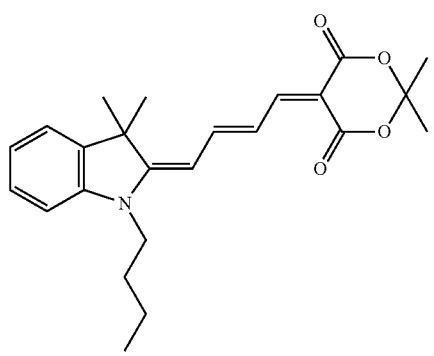
(Formula 5-13)
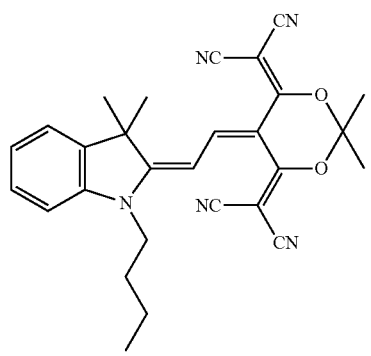
(Formula 5-14)
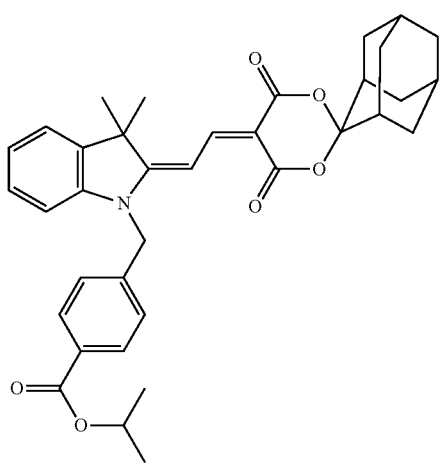
(Formula 5-15)
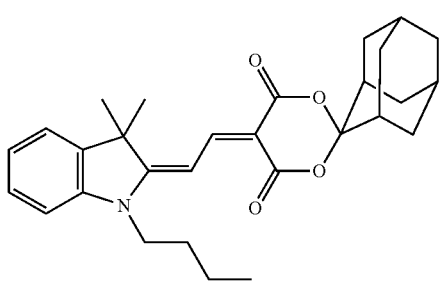
(Formula 5-16)
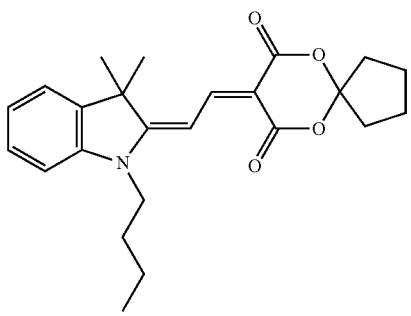
(Formula 5-17)
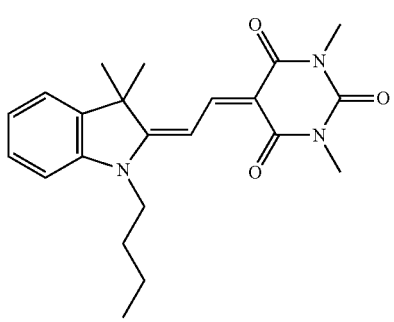
(Formula 5-18)
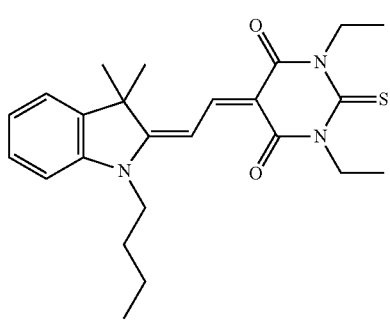
(Formula 5-19)
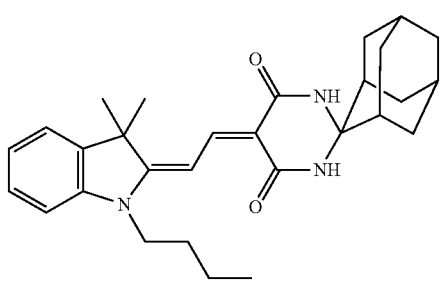

(Formula 5-20)

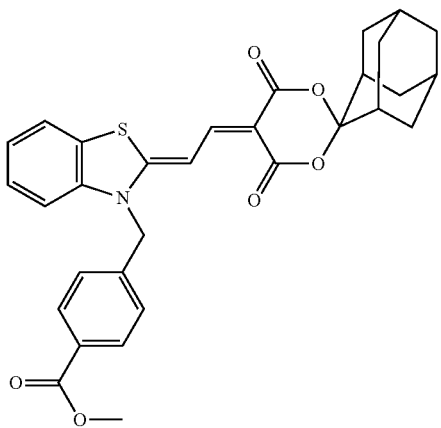

(Formula 5-21)

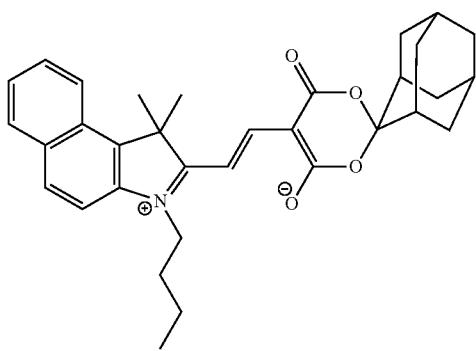

The photoresist layer may have a chemical formula as shown in Formula 6.

(Formula 6)

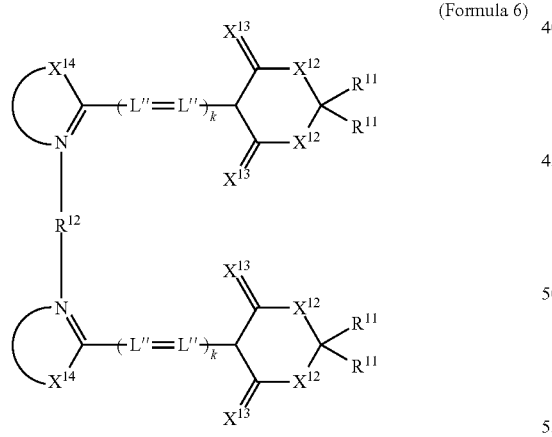

In Formula 6: each L″ independently represent a substituted or a non-substituted methine group; each $R^{11}$ independently represents a hydrogen atom, a substituted or a non-substituted alkyl group, a substituted or a non-substituted aryl group, a substituted or a non-substituted aralkyl group, or a substituted or a non-substituted heterocyclic ring; $R^{12}$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group; each $X^{12}$ independently represents an oxygen atom, a $CH_2$ group, or an $N\text{—}R^{13}$ group, wherein $R^{13}$ represents a substituted or a non-substituted $C_{1-18}$ alkyl group; each $X^{13}$ independently represents an oxygen atom or a $C(CN)_2$ group; each $X^{14}$ independently represents a substituted or a non-substituted alkylene group, or a substituted or a non-substituted alkylene group containing an oxygen atom, a sulfur atom, a selenium atom, or a nitrogen atom; and each k independently represents an integer of 0 or 1.

Formula 6 can be, but is not limited to, a specific compound as shown in Formula 6-1.

(Formula 6-1)

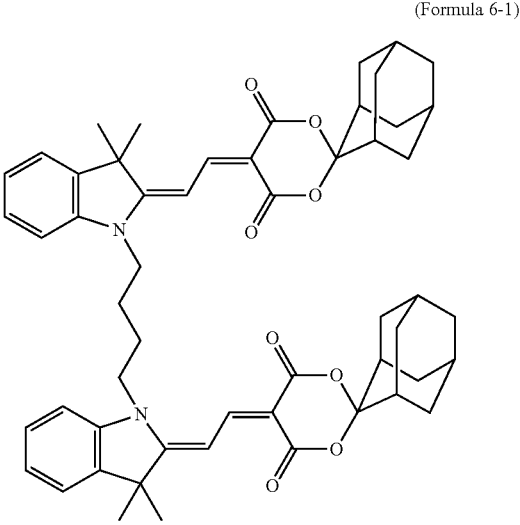 [SMILES: CC1(C)/C(=C/C=C2C(=O)OC3(OC2=O)C2CC4CC(C2)CC3C4)N(CCCCN2/C(=C/C=C3C(=O)OC4(OC3=O)C3CC5CC(C3)CC4C5)C(C)(C)c3ccccc32)c2ccccc21]

The photoresist layer may have a chemical formula as shown in Formula 7.

(Formula 7)

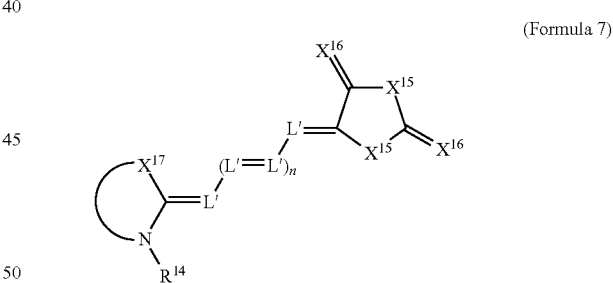

In Formula 7: each L′ independently represent a substituted or a non-substituted methine group; $R^{14}$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group; each $X^{15}$ independently represents an oxygen atom, a sulfur atom, a $CH_2$ group, or an $N\text{—}R^{15}$ group, wherein $R^{15}$ represents a hydrogen atom or a substituted or a non-substituted $C_{1-18}$ alkyl group; each $X^{16}$ independently represents an oxygen atom, a sulfur atom, or a $C(CN)_2$ group; $X^{17}$ represents a substituted or a non-substituted alkylene group, or a substituted or a non-substituted alkylene group containing an oxygen atom, a sulfur atom, a selenium atom, or a nitrogen atom; and n is an integer of 0 or 1.

Formula 7 can be, but is not limited to, specific compounds as shown in Formula 7-1 to 7-3.

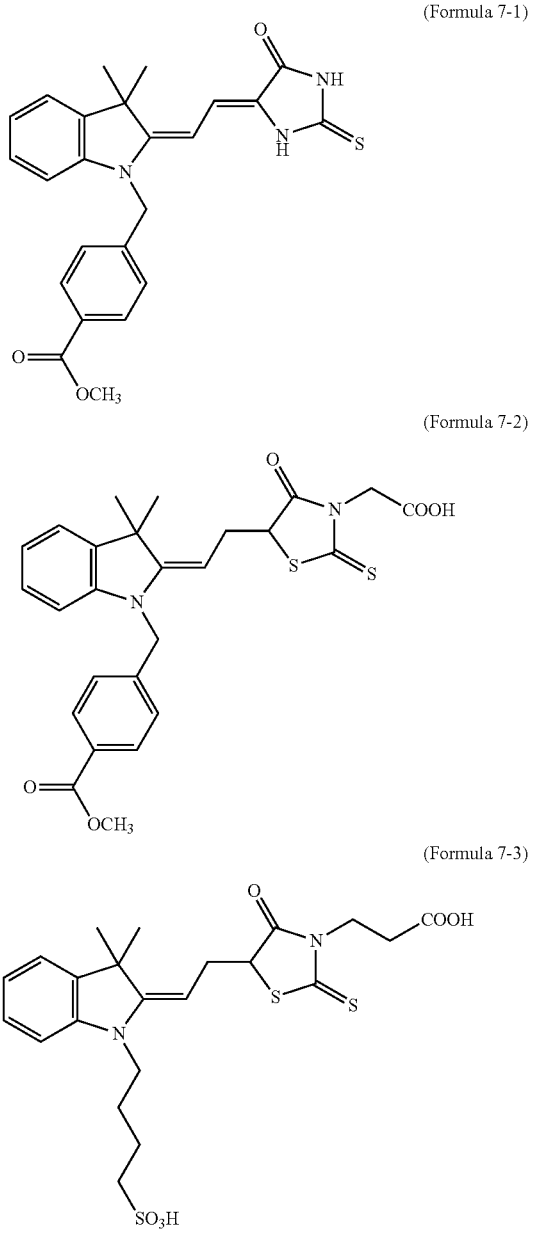

The above photoresist material collocated with the focused laser beam has several advantages. (1) The photoresist materials have high transparency and can be spin-coated on the layered material. Compared to the conventional PTM film, the photoresist materials of the disclosure have higher compatibility with existing equipment with a lower cost. (2) The photoresist materials of the disclosure are spin-coated other than ultra-vacuum sputtered on the layered material. Contents of the photoresist materials of the disclosure are easily controlled to be coated on a large area substrate without a microscopic crystal phase/structure caused from the conventional PTM process. The photoresist layer thickness can be controlled by simple factors (e.g. rotation speed or concentration of the spin-on solution). As such, the photoresist layer of the disclosure has uniform thickness. (3) The photoresist material of the disclosure is directly written on by the focused laser beam to process a heat chemistry surface relief reaction. The exposed pan of the photoresist material directly forms a groove or a pit without an additional development, thereby completing a patterned photoresist layer. (4) The photoresist material of the disclosure is patterned by thermal chemistry (pyrolysis). In other words, the conventional optical diffraction limit can be overcome, and the pattern resolution is therefore enhanced. For example, the laser beam can be focused to a spot with a nano-scaled (less than 100 nm) diameter, e.g. of 30 nm to 60 nm.

EXAMPLES

Example 1

The photoresist material was spin coated on an aluminum nitride substrate to form a photoresist layer. The photoresist layer was patterned by a focused laser beam with a wavelength of 405 nm to form an opening for exposing the aluminum nitride substrate. The laser beam had a moving speed of 3 m/s and a power of 3.5 W (or 7 W). Thereafter, the exposed part of the aluminum nitride substrate was etched by reactive ion etching (RIE) to form a pore in the aluminum nitride substrate. The pore had a depth of 250 nm and a width of 450 nm to 500 nm. The RIE was processed with a chamber pressure of 30 mtorr, a process gas of $BCl_3$/Ar (60 sccm/5 sccm), a plasma power of 300 W, and an etching period of 300 seconds. The photoresist materials, the photoresist layer thicknesses, the wavelength of maximum absorption in methanol of the photoresist materials, and the bottom opening widths (W) of the patterned photoresist layers were tabulated, respectively, and are shown in Table 1. Note that the pore in the substrate was broadened by the RIE factors. Those skilled in the an may adopt other anisotropic etching processes or factors to match the pore width and the bottom opening width of the patterned photoresist layer.

TABLE 1

| Photoresist material | Photoresist layer thickness | Wavelength of maximum absorption (in methanol) | Bottom opening width of the patterned photoresist layer |
|---|---|---|---|
| Formula 1-8 |  | 464 nm |  |
| Formula 1-13 |  | 453 nm |  |
| Formula 1-17 |  | 432 nm |  |
| Formula 1-19 |  | 391 nm |  |
| Formula 1-23 |  | 377 nm |  |
| Formula 2-1 |  | 396 nm |  |
| Formula 2-2 |  | 381 nm |  |
| Formula 2-10 |  | 435 nm |  |
| Formula 3-1 | 50 nm | 381 nm | 97 nm |
| Formula 3-2 |  | 379 nm |  |
| Formula 3-3 |  | 395 nm |  |
| Formula 3-4 |  | 394 nm |  |
| Formula 3-9 |  | 435 nm |  |
| Formula 4-1 |  | 478 nm |  |
| Formula 4-2 |  | 458 nm |  |
| Formula 5-2 | 100 nm | 452 nm | 231 nm |
| Formula 5-15 |  | 450 nm |  |
| Formula 5-18 | 100 nm | 489 nm | 350 nm |
| Formula 5-21 |  | 459 nm |  |
| Formula 5-21 |  | 431 nm |  |
| Formula 7-1 | 100 nm | 477 nm | 260 nm |
| Formula 7-2 |  | 497 nm |  |
| Formula 7-3 |  | 511 nm |  |

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. A method of patterning a layered material, comprising:
providing a layered material;
forming a photoresist layer on the layered material;
patterning the photoresist layer by a focused laser beam to expose a part of the layered material; and
etching the exposed part of the layered material to pattern the layered material,
wherein the photoresist layer has a chemical structure as shown in Formula 1, 2, 3, 4, 5, 6, or 7, and the Formulae are as follows:

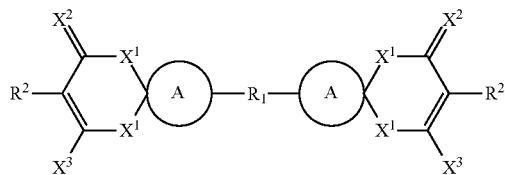

(Formula 1)

wherein each A independently represents a substituted or a non-substituted cyclic alkyl group;

$R^1$ represents a $CH_2$ group, an oxygen atom, or a $SO_2$ group;

each $R^2$ independently represents a hydrogen atom, an azo group, or a substituted or a non-substituted polymethine group;

each $X^1$ independently represent an oxygen atom, a $CH_2$ group, an alkyl group, or an N—$R^3$ group, wherein $R^3$ represents a hydrogen atom, a substituted or a non-substituted $C_{1-18}$ alkyl group, a substituted or a non-substituted $C_{1-18}$ alkoxy group, a substituted or a non-substituted $C_{1-18}$ as carboxyl group, a substituted or a non-substituted $C_{1-18}$ arylester group, an adamantyl carbonyl group, an adamantyl group, or a substituted or a non-substituted aralkyl group;

each $X^2$ independently represents an oxygen atom or a $C(CN)_2$ group; and each $X^3$ independently represents an oxygen atom posing one negative charge, a hydroxyl group, or a $C(CN)_2$ group;

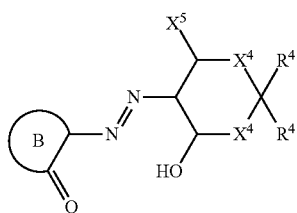

(Formula 2)

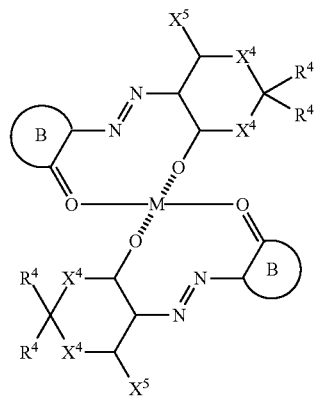

(Formula 3)

wherein each B independently represents a substituted or a non-substituted aromatic hydrocarbon ring, a substituted or a non-substituted aromatic heterocyclic ring, or a substituted or a non-substituted condensed ring including an aromatic hydrocarbon ring;

each $R^4$ independently represents a hydrogen atom, a C=S group, a substituted or non-substituted alkyl group, a substituted or non-substituted aryl group, a substituted or non-substituted aralkyl group, or a substituted or non-substituted heterocyclic group;

each $X^4$ independently represents an oxygen atom, a substituted or non-substituted alkyl group, or an N—$R^5$ group, wherein $R^5$ represents a hydrogen atom, a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group;

each $R^5$ independently represents an oxygen atom, a $C(CN)_2$ group, or a C=O group; and M represents Fe, Co, Cu, Ni, or Zn;

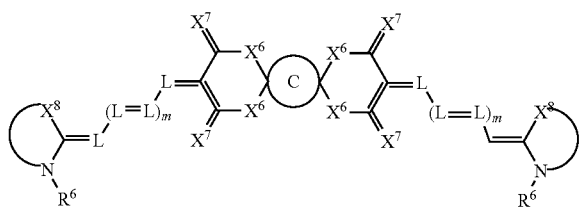

(Formula 4)

wherein C represents a substituted or a non-substituted cyclic alkyl group;

each L independently represents a substituted or a non-substituted methine group;

each $R^6$ independently represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group;

each $X^6$ independently represents an oxygen atom, a $CH_2$ group, or an $N—R^7$ group, wherein $R^7$ represents a substituted or a non-substituted $C_{1-18}$ alkyl group;

each $X^7$ independently represents an oxygen atom or a $C(CN)_2$ group;

each $X^8$ independently represents a substituted or a non-substituted alkylene group, or an a substituted or a non-substituted alkylene group containing an oxygen atom, a sulfur atom, a selenium atom, or a nitrogen atom; and each m independently represents an integer of 0 or 1;

(Formula 5)

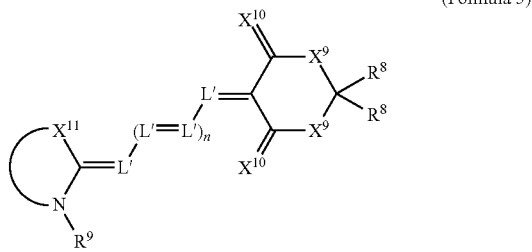

wherein each L' independently represent a substituted or a non-substituted methine group;

each $R^8$ independently represents a hydrogen atom, a substituted or a non-substituted alkyl group, a substituted or a non-substituted aryl group, a substituted or a non-substituted aralkyl group, a substituted or a non-substituted heterocyclic ring, or a ferrocenyl group;

$R^9$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group;

each $X^9$ independently represents an oxygen atom, a $CH_2$ group, or an $N—R^{10}$ group, wherein $R^{10}$ represents a substituted or a non-substituted $C_{1-18}$ alkyl group;

each $X^{10}$ independently represents an oxygen atom or a $C(CN)_2$ group;

$X^{11}$ represents a substituted or a non-substituted alkylene group, or a substituted or a non-substituted alkylene group containing an oxygen atom, a sulfur atom, a selenium atom, or a nitrogen atom; and n is an integer of 0 or 1;

(Formula 6)

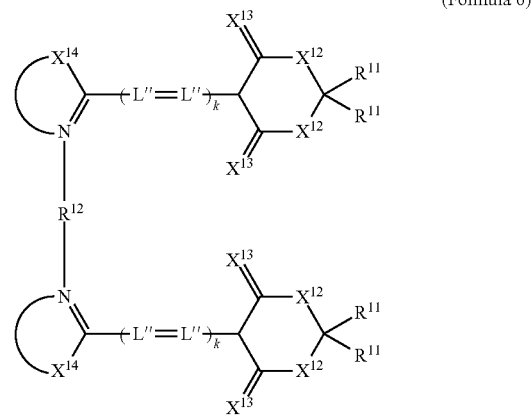

wherein each L'' independently represent a substituted or a non-substituted methine group;

each $R^{11}$ independently represents a hydrogen atom, a substituted or a non-substituted alkyl group, a substituted or a non-substituted aryl group, a substituted or a non-substituted aralkyl group, or a substituted or a non-substituted heterocyclic ring;

$R^{12}$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group;

each $X^{12}$ independently represents an oxygen atom, a $CH_2$ group, or an $N—R^{13}$ group, wherein $R^{13}$ represents a substituted or a non-substituted $C_{1-18}$ alkyl group;

each $X^{13}$ independently represents an oxygen atom or a $C(CN)_2$ group;

each $X^{14}$ independently represents a substituted or a non-substituted alkylene group, or a substituted or a non-substituted alkylene group containing an oxygen atom, a sulfur atom, a selenium atom, or a nitrogen atom; and each k independently represents an integer of 0 or 1;

(Formula 7)

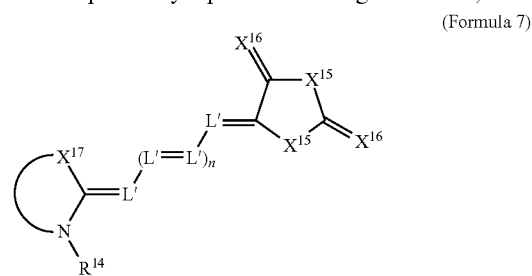

wherein each L' independently represent a substituted or a non-substituted methine group;

$R^{14}$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group;

each $X^{15}$ independently represents an oxygen atom, a sulfur atom, a $CH_2$ group, or an $N—R^{15}$ group, wherein $R^{15}$ represents a hydrogen atom or a substituted or a non-substituted $C_{1-18}$ alkyl group;

each $X^{16}$ independently represents an oxygen atom, a sulfur atom, or a $C(CN)_2$ group;

$X^{17}$ represents a substituted or a non-substituted alkylene group, or a substituted or a non-substituted alkylene group containing an oxygen 125 atom, a sulfur atom, a selenium atom, or a nitrogen atom; and n is an integer of 0 or 1.

2. The method as claimed in claim 1, wherein the photoresist layer has a thickness of 30 nm to 200 nm.

3. The method as claimed in claim 1, wherein the layered material comprises a substrate, and the substrate comprises crystalline silicon, quartz, silicon oxide, sapphire, aluminum nitride, gallium nitride, glass, polymer, or metal.

4. The method as claimed in claim 1, wherein the layered material comprises an intermediate layer disposed between the substrate and the photoresist layer, the substrate comprises crystalline silicon, quartz, silicon oxide, sapphire, aluminum nitride, gallium nitride, glass, polymer, or metal, and the intermediate layer comprises aluminum oxide, aluminum nitride, silicon carbide, silicon oxide, zinc sulfide-silicon oxide, polymer, or metal.

5. The method as claimed in claim 1, wherein the focused laser beam has a wavelength of 200 nm to 530 nm.

6. The method as claimed in claim 1, wherein the step of etching the exposed part of the layered material comprises dry etching, wet etching, or combinations thereof.

7. The method as claimed in claim 1, after the step of etching the exposed part of the layered material to pattern the layered material, further comprising:
  plating a metal layer on the patterned photoresist layer and the etched layered material; and
  removing the patterned photoresist layer and the etched layered material from the metal layer to obtain an imprinting mold.

8. The method as claimed in claim 1, after the step of etching the exposed part of the layered material to pattern the layered material, further comprising:
  removing the patterned photoresist layer.

9. The method as claimed in claim 8, after the step of removing the patterned photoresist layer, further comprising:
  plating a metal layer on the etched layered material; and
  removing the etched layered material from the metal layer to obtain an imprinting mold.

10. A method of forming an imprinting mold, comprising:
  providing a layered material;
  forming a photoresist layer on the layered material;
  patterning the photoresist layer by a focused laser beam to expose a part of the layered material;
  plating a metal layer on the patterned photoresist layer and the exposed part of the layered material; and
  removing the patterned photoresist layer and the layered material from the metal layer to obtain an imprinting mold,
  wherein the photoresist layer has a chemical structure as shown in Formula 1, 2, 3, 4, 5, 6, or 7, and the Formulae are as follows:

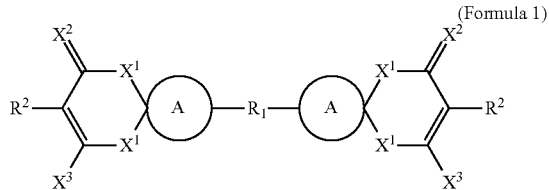
(Formula 1)

wherein each A independently represents a substituted or a non-substituted cyclic alkyl group;

$R^1$ represents a $CH_2$ group, an oxygen atom, or a $SO_2$ group;

each $R^2$ independently represents a hydrogen atom, an azo group, or a substituted or a non-substituted polymethine group;

each $X^1$ independently represent an oxygen atom, a $CH_2$ group, an alkyl group, or an N—$R^3$ group, wherein $R^3$ represents a hydrogen atom, a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ arylester group, an adamantyl carbonyl group, an adamantyl group, or a substituted or a non-substituted aralkyl group;

each $X^2$ independently represents an oxygen atom or a $C(CN)_2$ group; and each $X^3$ independently represents an oxygen atom posing one negative charge, a hydroxyl group, or a $C(CN)_2$ group;

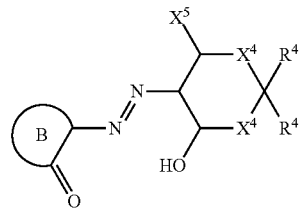
(Formula 2)

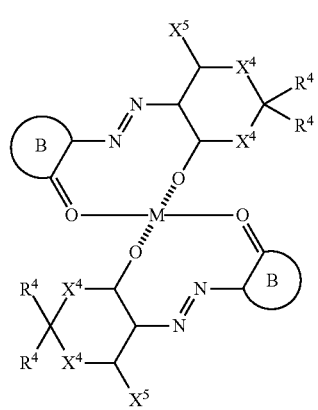
(Formula 3)

wherein each B independently represents a substituted or a non-substituted aromatic hydrocarbon ring, a substituted or a non-substituted aromatic heterocyclic ring, or a substituted or a non-substituted condensed ring including an aromatic hydrocarbon ring;

each $R^4$ independently represents a hydrogen atom, a C=S group, a substituted or non-substituted alkyl group, a substituted or non-substituted aryl group, a substituted or non-substituted aralkyl group, or a substituted or non-substituted heterocyclic group;

each $X^4$ independently represents an oxygen atom, a substituted or non-substituted alkyl group, or an N—$R^5$ group, wherein $R^5$ represents a hydrogen atom, a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group;

each $R^5$ independently represents an oxygen atom, a $C(CN)_2$ group, or a C=O group; and M represents Fe, Co, Cu, Ni, or Zn;

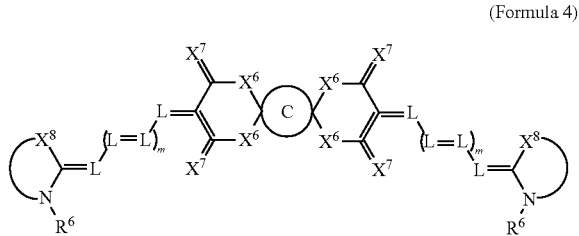
(Formula 4)

wherein C represents a substituted or a non-substituted cyclic alkyl group;

each L independently represents a substituted or a non-substituted methine group;

each $R^6$ independently represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group;

each $X^6$ independently represents an oxygen atom, a $CH_2$ group, or an $N—R^7$ group, wherein $R^7$ represents a substituted or a non-substituted $C_{1-18}$ alkyl group;

each $X^7$ independently represents an oxygen atom or a $C(CN)_2$ group:

each $X^8$ independently represents a substituted or a non-substituted alkylene group, or an a substituted or a non-substituted alkylene group containing an oxygen atom, a sulfur atom, a selenium atom, or a nitrogen atom; and each m independently represents an integer of 0 or 1;

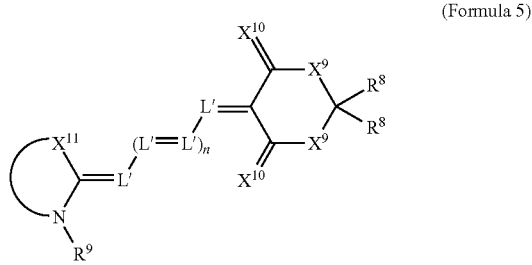

(Formula 5)

wherein each L' independently represent a substituted or a non-substituted methine group;

each $R^8$ independently represents a hydrogen atom, a substituted or a non-substituted alkyl group, a substituted or a non-substituted aryl group, a substituted or a non-substituted aralkyl group, a substituted or a non-substituted heterocyclic ring, or a ferrocenyl group;

$R^9$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group;

each $X^9$ independently represents an oxygen atom, a $CH_2$ group, or an $N—R^{10}$ group, wherein $R^{10}$ represents a substituted or a non-substituted $C_{1-18}$ alkyl group;

each $X^{10}$ independently represents an oxygen atom or a $C(CN)_2$ group;

$X^{11}$ represents a substituted or a non-substituted alkylene group, or a substituted or a non-substituted alkylene group containing an oxygen atom, a sulfur atom, a selenium atom, or a nitrogen atom; and n is an integer of 0 or 1;

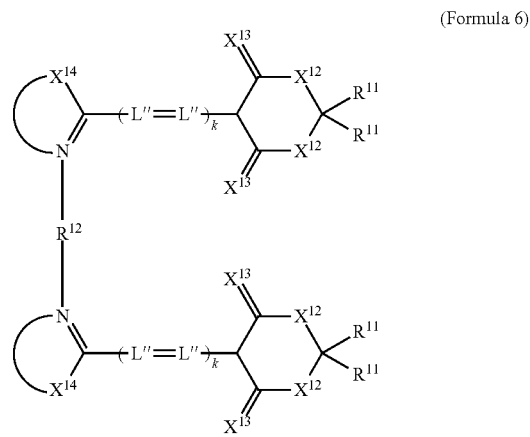

(Formula 6)

wherein each L" independently represent a substituted or a non-substituted methine group:

each $R^{11}$ independently represents a hydrogen atom, a substituted or a non-substituted alkyl group, a substituted or a non-substituted aryl group, a substituted or a non-substituted aralkyl group, or a substituted or a non-substituted heterocyclic ring;

$R^{12}$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group;

each $X^{12}$ independently represents an oxygen atom, a $CH_2$ group, or an $N—R^{13}$ group, wherein $R^{13}$ represents a substituted or a non-substituted $C_{1-18}$ alkyl group;

each $X^{13}$ independently represents an oxygen atom or a $C(CN)_2$ group;

each $X^{14}$ independently represents a substituted or a non-substituted alkylene group, or a substituted or a non-substituted alkylene group containing an oxygen atom, a sulfur atom, a selenium atom, or a nitrogen atom; and each k independently represents an integer of 0 or 1;

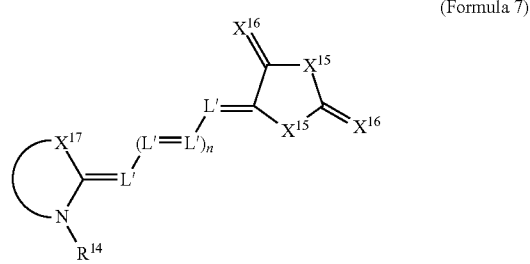

(Formula 7)

wherein each L' independently represent a substituted or a non-substituted methine group;

$R^{14}$ represents a substituted or a non-substituted $C_{1-18}$ alkyl group, a substituted or a non-substituted $C_{1-18}$ alkoxy group, a substituted or a non-substituted $C_{1-18}$ carboxyl group, a substituted or a non-substituted $C_{1-18}$ alkyl ester group, a substituted or a non-substituted arylester group, an adamantyl carbonyl group, an adamantyl group, or a substituted or a non-substituted aralkyl group;

each $X^{15}$ independently represents an oxygen atom, a sulfur atom, a $CH_2$ group, or an $N—R^{15}$ group, wherein $R^{15}$ represents a hydrogen atom or a substituted or a non-substituted $C_{1-18}$ alkyl group;

each $X^{16}$ independently represents an oxygen atom, a sulfur atom, or a $C(CN)_2$ group;

$X^{17}$ represents a substituted or a non-substituted alkylene group, or a substituted or a non-substituted alkylene group containing an oxygen atom, a sulfur atom, a selenium atom, or a nitrogen atom; and n is an integer of 0 or 1.

11. The method as claimed in claim 10, wherein the photoresist layer has a thickness of 30 nm to 200 nm.

12. The method as claimed in claim 10, wherein the layered material comprises a substrate, and the substrate comprises crystalline silicon, quartz, silicon oxide, sapphire, aluminum nitride, gallium nitride, glass, polymer, or metal.

13. The method as claimed in claim 10, wherein the layered material comprises an intermediate layer disposed between the substrate and the photoresist layer, the substrate comprises crystalline silicon, quartz, silicon oxide, sapphire, aluminum nitride, gallium nitride, glass, polymer, or metal, and the intermediate layer comprises aluminum oxide, aluminum nitride, silicon carbide, silicon oxide, zinc sulfide-silicon oxide, polymer, or metal.

14. The method as claimed in claim 10, wherein the focused laser beam has a wavelength of 200 nm to 530 nm.

* * * * *